US011168865B2

(12) United States Patent
Kuramoto et al.

(10) Patent No.: US 11,168,865 B2
(45) Date of Patent: Nov. 9, 2021

(54) LIGHT-EMITTING DEVICE AND BACKLIGHT

(71) Applicant: NICHIA CORPORATION, Anan (JP)

(72) Inventors: Masafumi Kuramoto, Tokushima (JP); Daisuke Iwakura, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 372 days.

(21) Appl. No.: 15/636,645

(22) Filed: Jun. 29, 2017

(65) Prior Publication Data

US 2018/0004040 A1 Jan. 4, 2018

(30) Foreign Application Priority Data

Jun. 30, 2016 (JP) .............................. JP2016-131050

(51) Int. Cl.
*G01V 8/00* (2006.01)
*F21V 5/02* (2006.01)
*H01L 25/075* (2006.01)
*G02B 19/00* (2006.01)
*G02F 1/13357* (2006.01)
(Continued)

(52) U.S. Cl.
CPC ............ *F21V 5/02* (2013.01); *G02B 19/0014* (2013.01); *G02F 1/133603* (2013.01); *H01L 25/0753* (2013.01); *G02B 6/0023* (2013.01); *G02B 6/0073* (2013.01); *G02B 19/0061* (2013.01); *G02F 1/133502* (2013.01); *H01L 33/20* (2013.01); *H01L 33/50* (2013.01); *H01L 2224/48137* (2013.01); *H01L 2224/8592* (2013.01)

(58) Field of Classification Search
CPC . F21V 5/02; G02B 19/0014; G02F 1/133603; H01L 25/0753
USPC ........................................ 250/559.36, 227.14
See application file for complete search history.

(56) References Cited

U.S. PATENT DOCUMENTS

2002/0063258 A1   5/2002  Motoki
2006/0043879 A1   3/2006  Naitou
(Continued)

FOREIGN PATENT DOCUMENTS

JP         11-340576      12/1999
JP        2002-217454      8/2002
(Continued)

*Primary Examiner* — Georgia Y Epps
*Assistant Examiner* — Kevin Wyatt
(74) *Attorney, Agent, or Firm* — Mori & Ward, LLP

(57) ABSTRACT

A light-emitting device includes a package having a recessed portion defined by a bottom surface and lateral walls surrounding the bottom surface, first and second light-emitting elements aligned in the longitudinal direction on the bottom surface, and a wavelength conversion member in the recessed portion, the wavelength conversion member converting light from the first light-emitting element. The first and second light-emitting elements each have a polygonal shape other than a rectangular shape in a front view. The first and second light-emitting elements are disposed away from each other so that a longest side of each light-emitting element will be substantially parallel to the longitudinal direction of the bottom surface and so that sides facing each other will be substantially parallel to each other. The wavelength conversion member is disposed at least in a region on the bottom surface between the first and second light-emitting elements.

20 Claims, 16 Drawing Sheets

(51) Int. Cl.
*H01L 33/20* (2010.01)
*F21V 8/00* (2006.01)
*H01L 33/50* (2010.01)
*G02F 1/1335* (2006.01)

(56) References Cited

U.S. PATENT DOCUMENTS

| | | | |
|---|---|---|---|
| 2006/0163602 A1 | 7/2006 | Isokawa | |
| 2007/0126011 A1 | 6/2007 | Lee | |
| 2008/0043477 A1 | 2/2008 | Yamamoto et al. | |
| 2008/0123344 A1 | 5/2008 | Shiraishi et al. | |
| 2008/0179619 A1* | 7/2008 | Wu | H01L 25/0753 |
| | | | 257/99 |
| 2009/0008654 A1 | 1/2009 | Nagai | |
| 2011/0175117 A1* | 7/2011 | Jagt | H01L 33/44 |
| | | | 257/88 |
| 2011/0175548 A1* | 7/2011 | Nishimura | H05B 45/30 |
| | | | 315/294 |
| 2011/0241030 A1* | 10/2011 | Kim | H01L 25/16 |
| | | | 257/88 |
| 2013/0056757 A1* | 3/2013 | Miyachi | H01L 27/153 |
| | | | 257/88 |
| 2013/0056780 A1 | 3/2013 | Kono | |
| 2013/0277694 A1* | 10/2013 | Sakuta | C09K 11/7739 |
| | | | 257/89 |
| 2014/0145218 A1 | 5/2014 | Kim et al. | |
| 2014/0239332 A1 | 8/2014 | Iwakura et al. | |
| 2014/0319568 A1* | 10/2014 | Kaide | C09K 11/7766 |
| | | | 257/98 |
| 2015/0008464 A1 | 1/2015 | Iwakura | |
| 2015/0138831 A1* | 5/2015 | Okano | G02B 6/0021 |
| | | | 362/609 |
| 2015/0340576 A1 | 11/2015 | Itoh | |
| 2016/0086927 A1 | 3/2016 | Sasaoka et al. | |

FOREIGN PATENT DOCUMENTS

| | | |
|---|---|---|
| JP | 2005-005433 | 1/2005 |
| JP | 2006-073656 | 3/2006 |
| JP | 2006-135309 | 5/2006 |
| JP | 2006-203058 | 8/2006 |
| JP | 2006-222248 | 8/2006 |
| JP | 2007-158296 | 6/2007 |
| JP | 2008-016565 | 1/2008 |
| JP | 2008-072074 | 3/2008 |
| JP | 2008-524831 | 7/2008 |
| JP | 2009-071174 | 4/2009 |
| JP | 2011-233808 | 11/2011 |
| JP | 2012-023249 | 2/2012 |
| JP | 2013-055187 | 3/2013 |
| JP | 2013-055190 | 3/2013 |
| JP | 2013-062279 | 4/2013 |
| JP | 2014-011359 | 1/2014 |
| JP | 2015-012194 | 1/2015 |
| JP | 2015-015371 | 1/2015 |
| JP | 2015032869 A * | 2/2015 |
| JP | 2016-063121 | 4/2016 |

* cited by examiner

LIGHT-EMITTING DEVICE AND BACKLIGHT

CROSS-REFERENCE TO RELATED APPLICATIONS

The present application claims priority under 35 U.S.C. § 119 to Japanese Patent Application No. 2016-131050, filed Jun. 30, 2016. The contents of this application are incorporated herein by reference in their entirety.

BACKGROUND OF THE INVENTION

1. Field of the Invention

The present disclosure relates to a light-emitting device and a backlight.

2. Description of Related Art

In the market for backlights, illumination devices, and automotive lighting devices, the need for miniaturization and enhancement in light extraction efficiency, output, and reliability of light-emitting devices including semiconductor light-emitting elements such as light-emitting diodes (LEDs) is increasing. In particular, the need for enhancement in efficiency and output as well as miniaturization and slimming down of side-view light-emitting devices for backlights is increasing.

In backlights including light guide plates, the emitting surfaces, in other words, the light-extracting surfaces, of side-view light-emitting devices are put near lateral surfaces of the light guide plates so that light will enter the light guide plates through the lateral surfaces. Dice having rectangular shapes in a front view are commonly used as LED chips mounted in the light-emitting devices. The light-emitting devices are attached to the lateral surfaces of the light guide plates so that long sides of the rectangular shapes of the light-emitting elements will be parallel to the upper surfaces and the lower surfaces of the light guide plates. In the light-emitting devices, resins containing fluorescent materials seal the light-emitting elements.

Examples of such side-view light-emitting devices include an LED module shown in FIG. 1 of Japanese Unexamined Patent Application Publication No. 2014-11359 and a white light-emitting diode shown in FIG. 2 of Japanese Unexamined Patent Application Publication No. 2007-158296.

SUMMARY OF THE INVENTION

According to one aspect of the present disclosure, a light-emitting device includes a package, a first light-emitting element, a second light-emitting element, and a wavelength conversion member. The package has a recessed portion. The recessed portion is defined by a bottom surface having a longitudinal direction and a short direction and lateral walls surrounding the bottom surface. The first light-emitting element and the second light-emitting element are aligned in the longitudinal direction of the bottom surface on the bottom surface of the recessed portion. The wavelength conversion member is provided in the recessed portion so as to convert light from the first light-emitting element into light having a different wavelength. The first light-emitting element and the second light-emitting element each have a polygonal shape other than a rectangular shape in a front view from a direction substantially perpendicular to the bottom surface. The first light-emitting element and the second light-emitting element are disposed on the bottom surface away from each other so that a longest side of each of the first light-emitting element and the second light-emitting element is parallel to or substantially parallel to the longitudinal direction of the bottom surface and so that a first side of the first light-emitting element and a second side of the second light-emitting element facing the first side are parallel to or substantially parallel to each other in the front view. The wavelength conversion member is disposed at least in a region on the bottom surface between the first light-emitting element and the second light-emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1:
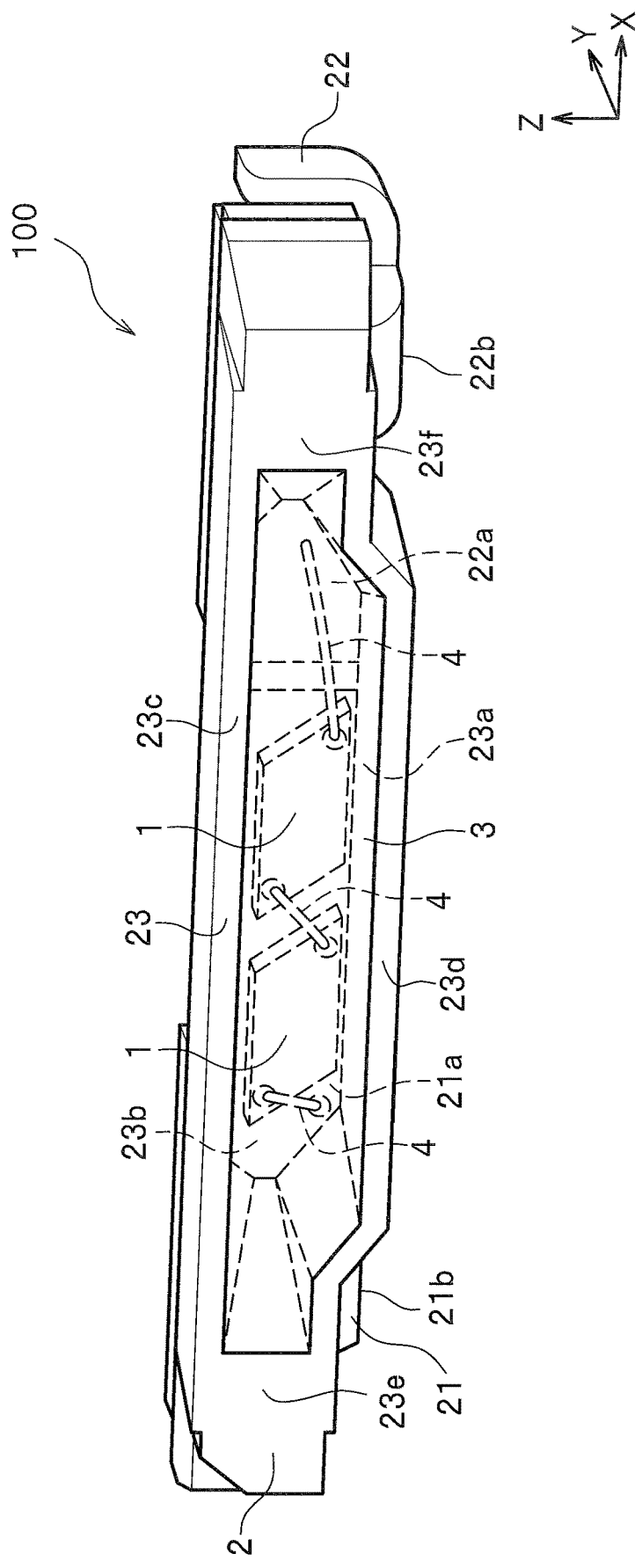
FIG. 1 is a schematic perspective view for illustrating a constitution of a light-emitting device according to a first embodiment.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

The following describes light-emitting devices and methods for manufacturing the light-emitting devices according to embodiments.

The drawings referred to in the descriptions below schematically illustrate the embodiments. The scales, the distances, the positional relations, and the like of members may be exaggerated, or illustration of part of the members may be omitted in some cases. Also, for example, the scales or the distances of the members in a front view or plan view may not be the same as the scales or the distances in a cross-sectional view. In the descriptions below, the same term or reference numeral generally represents the same member or a member made of the same material, and its detailed description will be omitted as appropriate.

In the light-emitting devices and the methods for manufacturing the devices according to the embodiments, directions such as "up", "down", "left", and "right" are interchangeable depending on the situation. Directions such as "up" and "down" in the present specification are not intended to represent absolute positions unless otherwise noted but represent relative positions of components in drawings referred to for the purpose of illustration.

First Embodiment

Constitution of Light-Emitting Device

Figure 2A:
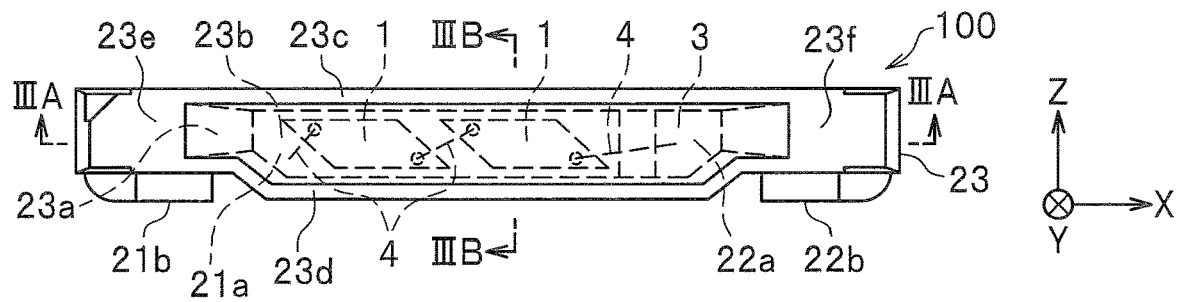
FIG. 2A is a schematic front view for illustrating the constitution of the light-emitting device according to the first embodiment.
Figure 2B:
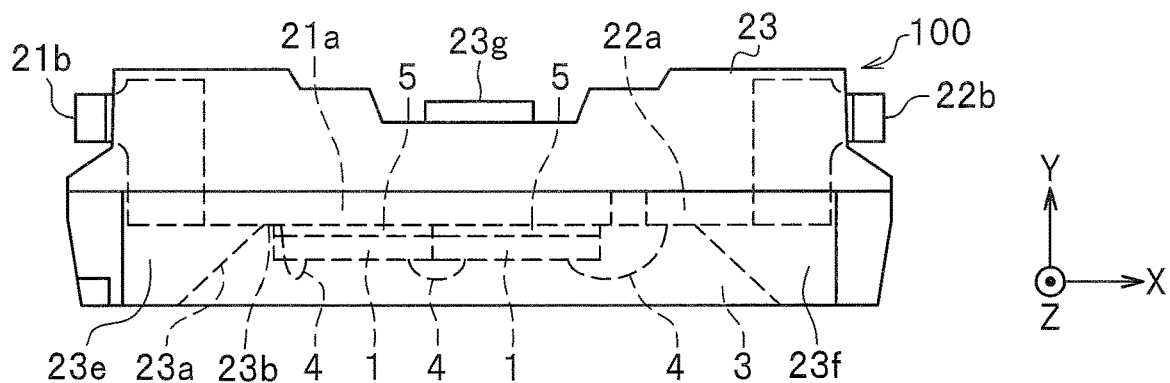
FIG. 2B is a schematic plan view for illustrating the constitution of the light-emitting device according to the first embodiment.
Figure 2C:
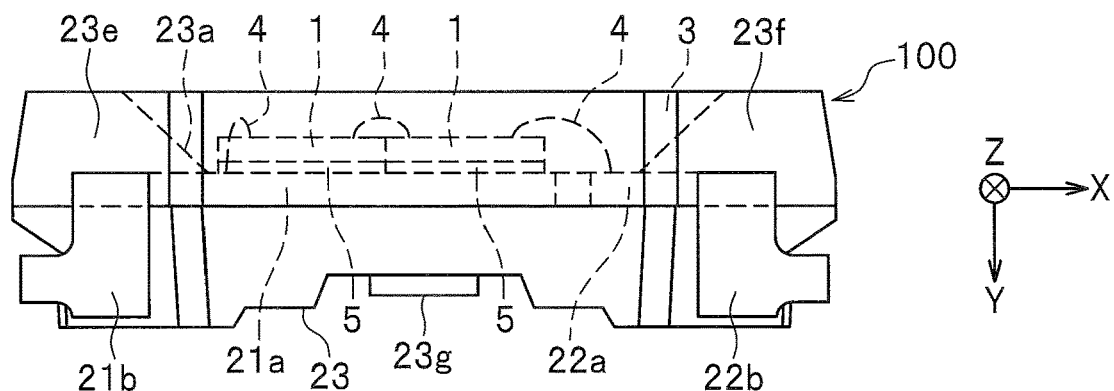
FIG. 2C is a schematic bottom view for illustrating the constitution of the light-emitting device according to the first embodiment.
Figure 2D:
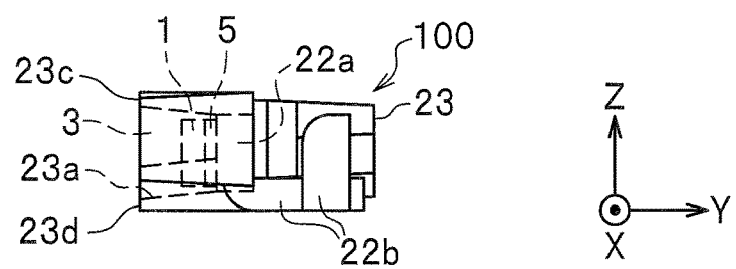
FIG. 2D is a schematic right side view for illustrating the constitution of the light-emitting device according to the first embodiment.
Figure 3A:
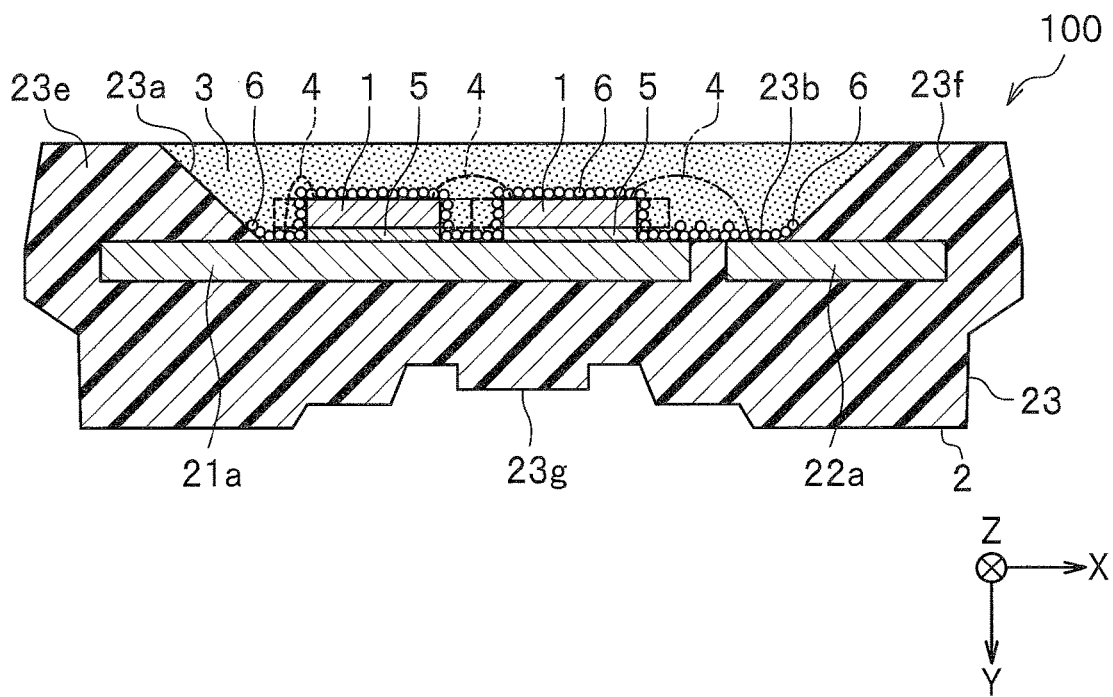
FIG. 3A is a schematic cross-sectional view for illustrating the constitution of the light-emitting device according to the first embodiment taken along the line IIIA-IIIA in FIG. 2A.
Figure 3B:
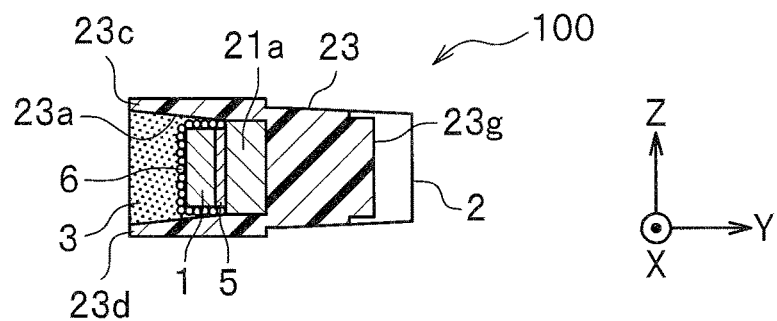
FIG. 3B is a schematic cross-sectional view for illustrating the constitution of the light-emitting device according to the first embodiment taken along the line IIIB-IIIB in FIG. 2A.

A constitution of a light-emitting device according to a first embodiment will be described referring to FIG. 1 to FIG. 3B. FIG. 1 is a schematic perspective view for illustrating the constitution of the light-emitting device according to the first embodiment. FIG. 2A is a schematic front view for illustrating the constitution of the light-emitting device according to the first embodiment. FIG. 2B is a schematic front view for illustrating the constitution of the light-emitting device according to the first embodiment. FIG. 2C is a schematic bottom view for illustrating the constitution of the light-emitting device according to the first embodiment. FIG. 2D is a schematic right side view for illustrating the constitution of the light-emitting device according to the first embodiment. FIG. 3A is a schematic cross-sectional view for illustrating the constitution of the light-emitting device according to the first embodiment taken along the line IIIA-IIIA in FIG. 2A. FIG. 3B is a schematic cross-sectional view for illustrating the constitution of the light-emitting device according to the first embodiment taken along the line IIIB-IIIB in FIG. 2A.

Coordinate axes are shown in each of FIG. 1 to FIG. 3B. For convenience, FIG. 2A taken in the positive direction of the Y axis is referred to as a front view, FIG. 2B taken in the negative direction of the Z axis is referred to as a plan view (top view), FIG. 2C taken in the positive direction of the Z axis is referred to as a bottom view, and FIG. 2D taken in the negative direction of the X axis is referred to as a right side view.

In each drawing, the longitudinal direction of a bottom surface 23b of a recessed portion 23a of a light-emitting device 100 is the X-axis direction, the short direction of the bottom surface 23b is the Z-axis direction, and a direction perpendicular to the bottom surface 23b is the Y-axis direction.

The light-emitting device 100 according to the first embodiment includes two light-emitting elements 1 and a package 2.

The two light-emitting elements (first and second light-emitting elements) 1 are disposed in the recessed portion 23a, which is open on the front side of the package 2, and are electrically connected in series between internal lead portions 21a and 22a of lead electrodes 21 and 22 via wires 4. The light-emitting elements 1 are bonded to the bottom surface 23b of the recessed portion 23a via a die-bonding resin 5. In addition, a light-transmissive sealing resin 3 is disposed in the recessed portion 23a to seal the light-emitting elements 1.

Light emitted from the light-emitting elements 1 is extracted from the open side of the recessed portion 23a in the negative direction of the Y axis, which is the front direction, through the light-transmissive sealing resin 3. The light-emitting device 100 is thin in the Z-axis direction, which is the thickness direction, so as to be suited for use as, for example, a light source for backlighting a liquid-crystal display.

The light-emitting elements 1 are bonded to the internal lead portion 21a of one polarity on the bottom surface 23b, which is perpendicular to the Y axis, of the recessed portion 23a of the package 2 via the die-bonding resin 5. Positive and negative pad electrodes (anodes and cathodes) of the two light-emitting elements 1 are electrically connected to the internal lead portions 21a and 22a via the bonding wires 4.

In the present embodiment, the light-emitting device 100 is a side-view device, and therefore the light-emitting elements 1 are mounted so that the main surfaces of substrates 11 of the light-emitting elements 1 will be perpendicular to the upper surface of the light-emitting device 100. For convenience, a plan view of the light-emitting elements 1 means observation from a direction of normal lines to the main surfaces of the substrates 11 in descriptions of the detailed constitution of the light-emitting elements 1 in the present specification. Hence, plane surfaces (upper surfaces) of the light-emitting elements 1 that have been mounted in the light-emitting device 100 are observed in a front view of the light-emitting device 100.

Figure 4A:
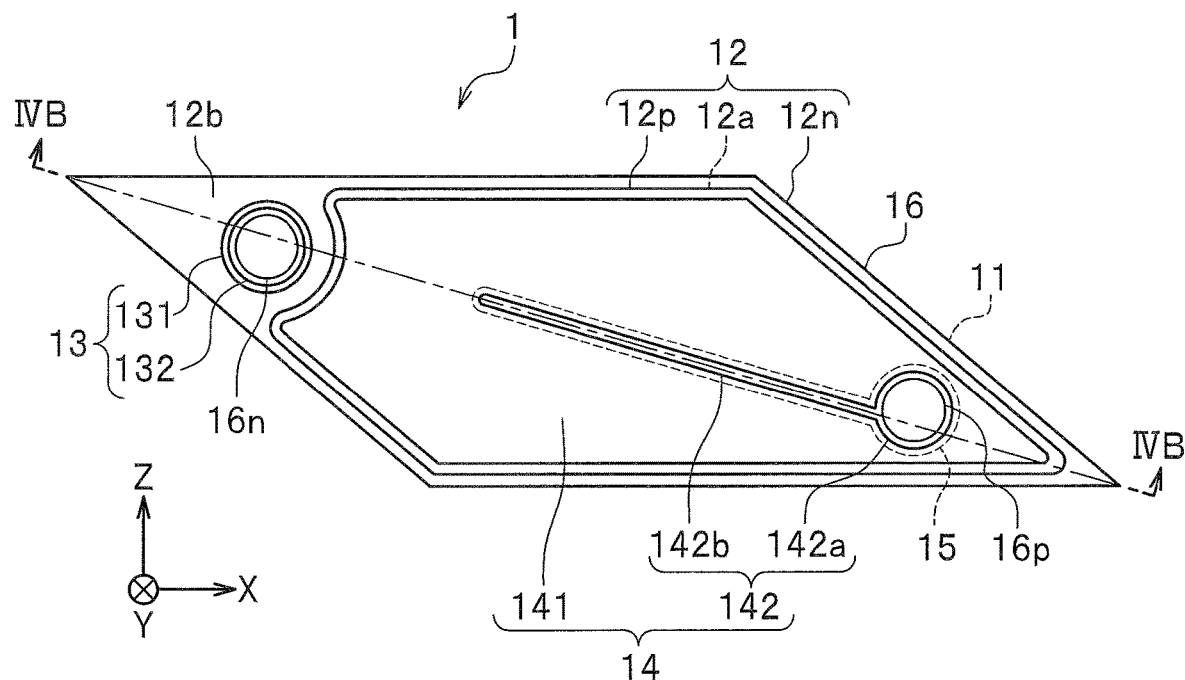
FIG. 4A is a schematic plan view for illustrating a detailed constitution of a light-emitting element in the light-emitting device according to the first embodiment.
Figure 4B:
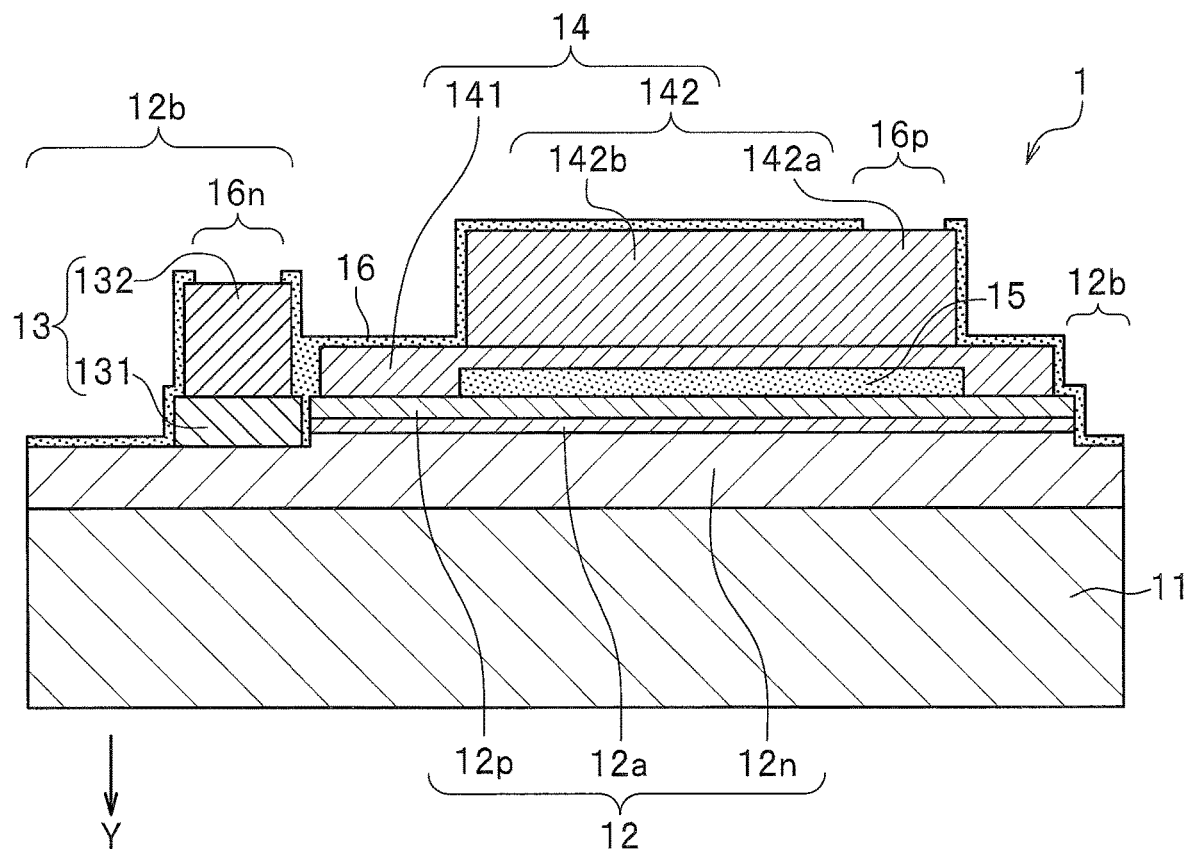
FIG. 4B is a schematic cross-sectional view for illustrating the detailed constitution of the light-emitting element in the light-emitting device according to the first embodiment taken along the line IVB-IVB in FIG. 4A.

An example of the detailed constitution of the light-emitting elements 1 will be described referring to FIG. 4A and FIG. 4B. FIG. 4A is a schematic plan view for illustrating the detailed constitution of the light-emitting element in the light-emitting device according to the first embodiment. FIG. 4B is a schematic cross-sectional view for illustrating the detailed constitution of the light-emitting element in the light-emitting device according to the first embodiment taken along the line IVB-IVB in FIG. 4A.

Semiconductor light-emitting elements such as LEDs can be suitably used as the light-emitting elements 1. The light-emitting elements 1 in the present embodiment are each formed into a laterally long parallelogram in a plan view taken in the negative direction of the Y axis and each include the substrate 11, a semiconductor layered body 12, an n-side electrode 13, a p-side electrode 14, an insulating film 15, and a protective film 16. The light-emitting element 1 in the present embodiment includes the semiconductor layered body 12 having a light-emitting diode (LED) structure on one main surface of the substrate 11 and includes the n-side electrode 13 and the p-side electrode 14 on one side of the semiconductor layered body 12. The light-emitting element 1 is therefore suitable for face-up mounting.

The recessed portion 23a has a substantially rectangular shape in a front view with the X-axis direction being the longitudinal direction and the Z-axis direction being the short direction. The shape of the light-emitting element 1 is a laterally long parallelogram in a front view of the light-emitting device 100. The long sides of the parallelogram are parallel to the X axis, which is the longitudinal direction of the bottom surface 23b. The two light-emitting elements 1 are aligned in the longitudinal direction of the bottom surface 23b so that short sides of the parallelograms will be away from and will face each other.

In a front view of the light-emitting device 100, the sides facing each other of the two light-emitting elements 1 are preferably inclined at an angle in a range of 15° to 75° with respect to the X axis, which is parallel to the longitudinal direction of the bottom surface 23b. Orthographic projections of the sides facing each other of the two light-emitting elements 1 onto the X axis, which is parallel to the longitudinal direction, preferably overlap each other. Disposing the two light-emitting elements 1 in this way can reduce unevenness in the longitudinal direction in the color and the luminance of emitted light. The reduction in unevenness in color and luminance will be described later in detail.

In the present specification, the case where the longitudinal direction of the light-emitting element 1 is "parallel to" or "substantially parallel to" the longitudinal direction of the bottom surface 23b of the recessed portion 23a includes the case where the longitudinal direction of the light-emitting element 1 is inclined at an angle equal to or less than 10° with respect to the longitudinal direction of the bottom surface 23b.

Unless otherwise noted, in the present specification, the "parallelogram" does not include rectangles regarding the shape of the light-emitting element 1 in a front view, that is, the outer shape of the light-emitting element 1 in a front view of the light-emitting device 100. That is, no internal angle of the parallelogram is a right angle.

The parallelogram in the present specification includes a rhombus, the four sides of which have the same length. In the case where the outer shape of the light-emitting element 1 is a rhombus, the light-emitting element 1 is disposed so that any of its sides will be parallel to the X axis, which is the longitudinal direction of the bottom surface 23b.

The substrate 11 supports the semiconductor layered body 12. The substrate 11 may be a growth substrate for epitaxially growing the semiconductor layered body 12. For example, a sapphire ($Al_2O_3$) substrate can be used as the substrate 11 in the case where a nitride semiconductor is used for the semiconductor layered body 12.

The semiconductor layered body 12 includes an n-type semiconductor layer 12n and a p-type semiconductor layer 12p layered on one main surface of the substrate 11 and emits light when supplied with a current between the n-side electrode 13 and the p-side electrode 14. The semiconductor layered body 12 preferably includes an active layer 12a between the n-type semiconductor layer 12n and the p-type semiconductor layer 12p.

The semiconductor layered body 12 has a region in which the p-type semiconductor layer 12p and the active layer 12a are partly absent, that is, a stepped portion 12b recessed from the surface of the p-type semiconductor layer 12p. The n-type semiconductor layer 12n constitutes the bottom surface of the stepped portion 12b. In the present embodiment, the stepped portion 12b is formed along the outer edges of the light-emitting element 1 and is broader at the left-end corner than in the other portions. The n-side electrode 13 is disposed on part of the bottom surface of the stepped portion 12b at the left-end corner and is electrically connected to the n-type semiconductor layer 12n.

A light-transmissive electrode 141 is disposed on substantially the entire upper surface of the p-type semiconductor layer 12p to constitute a lower layer of the p-side electrode 14, and a pad electrode 142 is disposed on part of the upper surface of the light-transmissive electrode 141. The insulating film 15 is disposed between the p-type semiconductor layer 12p and the light-transmissive electrode 141 in a region directly below the pad electrode 142 and a region near that region in a plan view.

The surfaces of the semiconductor layered body 12, the n-side electrode 13, and the p-side electrode 14 are covered with the protective film 16 except for external connecting portions of a pad electrode 132 and the pad electrode 142.

The semiconductor layered body 12 is suitably formed by layering a semiconductor on a substrate by the MOCVD method or the like. A gallium nitride semiconductor represented by $In_XAl_YGa_{1-X-Y}N$ ($0 \leq X$, $0 \leq Y$, $X+Y<1$) can be more suitably used as the semiconductor material because its emission wavelengths can be selected from the ultraviolet to infrared range by selecting its mixing ratio.

The n-side electrode 13 is disposed on the bottom surface of the stepped portion 12b of the semiconductor layered body 12 and is electrically connected to the n-type semiconductor layer 12n. The n-side electrode 13 is a negative electrode for supplying the light-emitting element 1 with a current from outside. The n-side electrode 13 has a structure in which a light-reflective film 131 and the pad electrode 132 are layered.

The light-reflective film 131, which is the lower layer, reflects light incident on the lower surface of the n-side electrode 13 from within the semiconductor layered body 12, thereby suppressing absorption of the light by the n-side electrode 13 and enhancing efficiency of extraction of light to the outside. Hence, the light-reflective film 131 preferably has a light-reflecting property better than at least the light-reflecting property of the lower surface of the pad electrode 132 with respect to the wavelengths of light emitted from the semiconductor layered body 12. Examples of the metal film 17 include Al, Ru, Ag, Ti, Ni, and alloys containing any of these metals as main components.

The pad electrode 132, which is on the upper layer, is connected to an external power supply. To facilitate the connection to the outside by wire bonding, for example, Cu, Au, or alloys containing any of these metals as the main component can be used for the pad electrode 132.

The p-side electrode 14 is disposed on the upper surface of the p-type semiconductor layer 12p and is electrically connected to the p-type semiconductor layer 12p. The p-side electrode 14 is a positive electrode for supplying the light-emitting element 1 with a current from outside. The p-side electrode 14 has a structure in which the light-transmissive electrode 141 and the pad electrode 142 are layered.

The light-transmissive electrode 141, which is the lower layer, covers substantially the entire upper surface of the p-type semiconductor layer 12p. The light-transmissive electrode 141 functions as a current diffusing layer for diffusing the current, which is supplied from outside through the pad electrode 142, into the entire surface of the p-type semiconductor layer 12p. Light emitted from the semiconductor layered body 12 is extracted to the outside mainly through the light-transmissive electrode 141. Hence, the light-transmissive electrode 141 preferably has a good light-transmitting property with respect to the wavelengths of light emitted from the semiconductor layered body 12.

The light-transmissive electrode 141 is formed of an electrically-conductive metal oxide. Examples of the electrically-conductive metal oxide include oxides containing at least one element selected from the group consisting of Zn (zinc), In (indium), Sn (tin), Ga (gallium), and Ti (titanium). Among these materials, ITO (Sn-doped $In_2O_3$) is a suitable material for covering substantially the entire upper surface of the p-type semiconductor layer 12p because ITO has a high visible transmittance (in the visible range) and a high electrical conductivity.

The pad electrode 142, which is on the upper layer, is disposed on part of the upper surface of the light-transmissive electrode 141 and is connected to an external electrode. The pad electrode 142 includes an external connecting portion 142a to be connected to the outside by wire bonding or the like, and an extending portion 142b that extends from the external connecting portion 142a toward the n-side electrode 13 along a diagonal line of the parallelogram, which is the outer shape of the light-emitting element 1 in a plan view, to diffuse the current more efficiently.

To facilitate the connection to the outside by wire bonding, for example, Cu, Au, or alloys containing any of these metals as the main component can be used for the pad electrode 142 as in the case of the pad electrode 132 of the n-side electrode 13.

In the present embodiment, the same material constitutes the external connecting portion 142a and the extending portion 142b of the pad electrode 142.

The pad electrode 132, which is an external connecting portion of the n-side electrode 13, is disposed near one of the acute corners of the parallelogram, which is the outer shape of the light-emitting element 1. The external connecting portion 142a, which is the external connecting portion of the p-side electrode 14, of the pad electrode 142 is disposed near the other acute corner of the parallelogram, which is the outer shape of the light-emitting element 1 in a plan view. Hence, the external connecting portions of the electrodes of the light-emitting element 1 are connected to the internal lead portions 21a and 22a of the lead electrodes 21 and 22 via the wires 4 across the short sides of the parallelogram adjacent to the external connecting portions of the electrodes of the light-emitting element 1, thereby reducing regions for wire bonding of the internal lead portions 21a and 22a in the longitudinal direction.

The reduction in the regions for wire bonding will be described in further details.

Positions on the internal lead portions 21a and 22a at which the wires 4 are connected are required to be a certain distance away from the outer edges of the light-emitting element 1. In particular, the need to slim down the light-emitting device 100 may make it difficult to provide sufficient regions for wire bonding on the bottom surface 23b of the recessed portion 23a in the short direction of the light-emitting element 1 in a state where the light-emitting element 1 has been disposed. For this reason, in the case of a light-emitting element 1 having a laterally-long rectangular outer shape, the wires 4 each extend in the longitudinal direction of the bottom surface 23b across a short side of the rectangle and are bonded at a certain distance away from the light-emitting element 1. In other words, in the case of the light-emitting element 1 having a rectangular outer shape, there is the need to provide regions to which the wires 4 are bonded, in addition to the region in which the light-emitting element 1 is disposed, in the longitudinal direction of the bottom surface 23b.

On the other hand, in the case of the light-emitting element 1 having a parallelogrammic outer shape, a region to which the other end of the wire 4 is bonded can be provided on the bottom surface 23b in the short direction viewed from the external connecting portion of the n-side electrode 13 or the p-side electrode 14 disposed near the corresponding acute corner of the parallelogram. Accordingly, the wires 4 can be disposed so as to extend from the external connecting portions of the light-emitting element 1 across the adjacent short sides in the short direction of the bottom surface 23b or a slant direction. Hence, the regions to which the wires 4 are bonded can be reduced in the longitudinal direction of the bottom surface 23b. In other words, the light-emitting element 1 can be disposed close to an edge of the bottom surface 23b in the longitudinal direction.

To provide sufficient regions for wire bonding, the short sides are preferably inclined at an angle of about 15° to 75° with respect to the longitudinal direction of the bottom surface 23b.

The insulating film 15 is disposed in the region directly below the pad electrode 142 and a region near that region on the p-type semiconductor layer 12p so as to cover the pad electrode 142 in a plan view. The insulating film 15 is disposed between the p-type semiconductor layer 12p and the light-transmissive electrode 141, thereby reducing the current passing through the region of the p-type semiconductor layer 12p directly below the pad electrode 142 and suppressing light emission in this region. The quantity of light propagating toward the pad electrode 142 is reduced, and therefore the quantity of light absorbed by the pad electrode 142 is reduced. Accordingly, the total quantity of light emitted from the semiconductor layered body 12 can be increased.

The insulating film 15 is preferably made of a light-transmissive material having a refractive index smaller than the refractive index of the light-transmissive electrode 141. Such a material can enhance total reflection of light propagating upward within the semiconductor layered body 12 by the interface between the p-type semiconductor layer 12p and the insulating film 15 based on Snell's law. In other words, light traveling toward the pad electrode 142 is efficiently reflected before the light reaches the pad electrode 142, thereby reducing light absorption by the pad electrode 142.

For example, oxides such as $SiO_2$, $TiO_2$, and $Al_2O_3$, nitrides such as SiN, and fluorides such as MgF can be suitably used as the insulating film 15. Among these materials, $SiO_2$, which has a small refractive index, is more suitable.

The protective film 16 is a light-transmissive insulating film that covers substantially the entire upper and lateral surfaces of the light-emitting element 1 except for the lateral and lower surfaces of the substrate 11. The protective film 16 has an opening 16n above the upper surface of the pad electrode 132 and an opening 16p above the upper surface of the pad electrode 142. The above materials for the insulating film 15 can be used for the protective film 16. For example, $SiO_2$ can be suitably used.

In the light-emitting element 1, the shapes of the n-side electrode 13, the p-side electrode 14, the region in which the stepped portion 12b is formed, and the pad electrodes 132 and 142 are not limited to the shapes in the present embodiment and can be selected as appropriate. The n-side electrode 13 may also have an extending portion.

Referring back to FIG. 1 to FIG. 3B, the following continues to describe the constitution of the light-emitting device 100.

The package 2 includes the lead electrodes 21 and 22 and a resin unit 23. The package 2 has a substantially rectangular-cuboid outer shape that is thin in the Z-axis direction, which is the thickness direction of the light-emitting device 100. The package 2 is suited to side-view mounting, which is suitably employed for light sources for backlighting liquid-crystal displays.

The lead electrode 21 and the lead electrode 22 are a pair of electrodes corresponding to positive and negative polarities. The lead electrodes 21 and 22 include the internal lead portions 21a and 22a on which the light-emitting elements 1 are mounted in the resin unit 23, and external lead portions 21b and 22b that protrude from the bottom side of the resin unit 23 and serve as terminals used for connection to a mounting board.

The lead electrodes 21 and 22 are made of a metal plate and may be corrugated plates or plates having projections and recesses. The thickness may be uniform, or part of the plates may be thick or thin.

The internal lead portions 21a and 22a are exposed from the resin unit 23 on the bottom surface 23b perpendicular to the Y axis. On the bottom surface 23b of the recessed portion 23a, the internal lead portion 21a is electrically separated from the internal lead portion 22a. The light-emitting elements 1 are bonded to the internal lead portion 21a via the die-bonding resin with the semiconductor layered body 12 being insulated from the internal lead portion 21a. The n-side electrode 13 and the p-side electrode 14 of the light-emitting element 1 are electrically connected to the internal lead portions 21a and 22a via the wires 4 so that the two light-emitting elements 1 will be connected in series between the internal lead portions 21a the 22a of the pair of polarities.

The external lead portions 21b and 22b are continuous with the respective internal lead portions 21a and 22a of corresponding polarities. The external lead portions 21b and 22b protrude from the bottom surface of the resin unit 23, curve along the bottom surface of the resin unit 23 to extend in the positive direction of the Y axis, which is the back side, and further curve partly to extend in the positive direction of the Z axis, which is the upper direction, along the right and left lateral surfaces of the resin unit 23. The external lead portions 21b and 22b are bonded to a wiring pattern of the mounting board using an electrically-conductive adhesive member such as solder with the bottom surface of the light-emitting device 100 facing the mounting board, so that the light-emitting device 100 is mounted.

The material constituting the lead electrodes 21 and 22 is not particularly limited but is preferably a material having a comparatively large thermal conductivity, a material having a comparatively large mechanical strength, or a material easy to punch or etch. Specific examples include metals such as copper, aluminum, gold, silver, tungsten, iron, and nickel and alloys such as iron-nickel alloys and phosphor bronze. Portions of the internal lead portions 21a and 22a exposed on the bottom surface 23b of the recessed portion 23a are preferably plated with a material having a good light-reflecting property, such as Ag, to efficiently extract light from the light-emitting elements 1 to be mounted and a wavelength conversion member 6.

The resin unit 23 is a main body of the package 2. The resin unit 23 encloses the internal lead portions 21a and 22a and supports the lead electrodes 21 and 22. The external lead portions 21b and 22b continuous with the internal lead portions 21a and 22a protrude from the bottom surface of the resin unit 23. The external lead portions 21b and 22b curve so as to extend along the bottom surface and the lateral surfaces of the resin unit 23.

The resin unit 23 has the recessed portion 23a that is open in the negative direction of the Y axis, which is the front side of the light-emitting device 100. The internal lead portions 21a and 22a are exposed on the bottom surface 23b, which is a normal vector to which is the negative direction of the Y axis, of the recessed portion 23a. The light-emitting elements 1 are mounted on the surface of the internal lead portion 21a exposed from the resin unit 23.

The back surface of the resin unit 23 has a gate mark 23g that is a mark of a gate through which a resin material is injected into molds when forming the resin unit 23 by injection molding.

The resin unit 23 is formed of a material to which the light-reflecting property is imparted by incorporating particles of a light-reflective substance into a light-transmissive resin. The resin unit 23 functions also as a light-reflective member for reflecting light in the recessed portion 23a from the light-emitting elements 1 to make the light be efficiently emitted in the front direction.

The light-transmissive sealing resin 3 is charged into the recessed portion 23a.

The recessed portion 23a is defined by the bottom surface 23b and lateral walls surrounding the bottom surface 23b and has a laterally-long substantially rectangular opening shape in a front view. More specifically, the opening shape is a reentrant octagon that can be formed by denting the lower corners of a rectangle in a front view. The bottom surface 23b has a laterally-long substantially rectangular shape and includes the internal lead portions 21a and 22a. More specifically, the bottom surface 23b has a hexagonal shape that can be formed by chamfering the lower corners of a rectangle.

The lateral walls of the recessed portion 23a include an upper wall portion 23c and a lower wall portion 23d facing each other in the Z-axis direction, which is the thickness direction of the light-emitting device 100, and a left wall portion 23e and a right wall portion 23f facing each other in the X-axis direction, which is the width direction of the light-emitting device 100.

In the case where the bottom surface 23b of the recessed portion 23a has a rectangular or substantially rectangular shape, it is also possible that the longest side of one of the light-emitting elements 1 faces one of the long sides of the bottom surface 23b, and the longest side of the other light-emitting element 1 faces the other long side of the bottom surface 23b. The long sides herein are the sides parallel to the longitudinal direction of the bottom surface 23a among the sides constituting the periphery of the bottom surface 23a.

The upper wall portion 23c and the lower wall portion 23d are thinner than the left wall portion 23e and the right wall portion 23f. Part of the internal lead portions 21a and 22a disposed on the bottom surface 23b of the recessed portion 23a extends to the outer surface of the outer lateral surface of the lower wall portion 23d, which is one of the thinner wall portions, protrudes as the external lead portions 21b and 22b used as connection terminals to the outside from the outer surface of the outer lateral surface, and curves to extend along the lower surface of the resin unit 23.

As described above, the lead electrodes 21 and 22 are disposed so that the light-emitting device 100 will be suited to side-view mounting, and the resin unit 23 is constituted so that the side-view light-emitting device 100 will be slimmed down.

The upper wall portion 23c, the lower wall portion 23d, the left wall portion 23e, and the right wall portion 23f have inner lateral surfaces inclined toward the Z-axis direction, which is the height direction, or the X-axis direction, which is the width direction, so that the recessed portion 23a will broaden in a direction from the bottom surface 23b, on which the light-emitting elements 1 are mounted, of the recessed portion 23a toward the open side. Hence, light emitted from the lateral surfaces (surfaces parallel to the Y axis) of the light-emitting elements 1 toward the inner lateral surfaces of the recessed portion 23a is reflected by the inclined inner lateral surfaces toward the negative direction, which is the front direction, of the Y axis.

The inner lateral surfaces of the upper wall portion 23c and the lower wall portion 23d may not be inclined but be substantially perpendicular to the bottom surface 23b of the recessed portion 23a so that the light-emitting device 100 will be further slimmed down. The shape of the bottom surface 23b and the opening shape of the recessed portion 23a are preferably laterally long shapes. The shapes are not limited to the above hexagon or octagon but may be rectangles or other polygons, or ellipses.

The resin material used for the resin unit 23 preferably has a good light-transmitting property with respect to the wavelengths of light emitted from the light-emitting elements 1. Examples of the resin material include silicone resins, modified silicone resins, silicone hybrid resins, epoxy resins, modified epoxy resins, urea resin, phenolic resins, polycarbonate resins, acrylic resins, polymethylpentene resin, polynorbornene resin, polyphthalamide resin, unsaturated polyester resins, polyester resins, liquid crystal resins, polyphenylene ether resins, polyamide resins, and hybrid resins each containing at least one of these resins.

As the light-reflective substance incorporated into the resin unit 23, particles of a material that greatly differs in refractive index from the above resin material and has a good light-transmitting property are preferably used. The light-reflective substance preferably has a refractive index of, for example, equal to or more than 1.8, and the difference in refractive index from the resin material is, for example, preferably equal to or more than 0.4. The average grain diameter of the particles of the light-reflective substance is preferably in a range of 0.08 µm to 10 µm, so that light-scattering effects can be obtained efficiently.

In the present specification, values of the average grain diameters of materials such as the light-reflective substance and a wavelength conversion substance herein are obtained by observation with an electron microscope. The Feret diameter, which is based on the length measured in the direction of a specific axis, of the particles is determined on the basis of the number (number-size distribution) by measuring the particle size with an electron microscope (SEM or TEM).

Specifically, particles of a white pigment such as $TiO_2$ (titanium oxide) and $Al_2O_3$ (aluminum oxide) can be used as the light-reflective substance. $TiO_2$ is particularly preferable because $TiO_2$ is comparatively stable toward water and the like and has a high refractive index and a good thermal conductivity.

The resin material contains the light-reflective substance in a range that is enough to provide a sufficient light-reflecting effect and that does not impair formability in forming the shape of the package. Hence, the content of the light-reflective substance in the resin unit 23 is preferably in a range of 10% by mass to 60% by mass.

The sealing resin 3 includes a light-transmissive resin material as the main component and fills the recessed portion 23a of the resin unit 23 to seal the light-emitting elements 1 mounted on the bottom surface 23b of the recessed portion 23a. The sealing resin 3 may contain particles of a fluorescent material, which is a kind of wavelength conversion substance, as the wavelength conversion member 6 that converts light emitted from the light-emitting elements 1 into light having a different wavelength. For example, if the light-emitting elements 1 emit blue light and the wavelength conversion member 6 converts part of the blue light into yellow light, the light-emitting device 100 can emit a mixture of these two types of light, that is, white light.

The sealing resin 3 may contain a plurality of types of wavelength conversion member 6 and may contain a light-diffusing substance instead of or in addition to the wavelength conversion member 6.

The sealing resin 3 is preferably made of a material that has a good light-transmitting property with respect to the wavelengths of light emitted from the light-emitting elements 1 and the wavelength conversion member 6 and has good resistance to weather, light, and heat as an sealing member. Examples of such a material include the above resin materials for the resin unit 23 and glass. As the material of the sealing resin 3, silicone resins and fluorine resins having good resistance to heat and light are particularly preferable.

Materials known in the field of the invention can be used as the wavelength conversion member 6. Examples include cerium-activated yttrium-aluminum-garnet (YAG) fluorescent materials that emit green to yellow light, cerium-activated lutetium-aluminum-garnet (LAG) fluorescent materials that emit green light, europium and/or chromium-activated nitrogen-containing calcium aluminosilicate ($CaO-Al_2O_3-SiO_2$) fluorescent materials that emit green to red light, europium-activated silicate (($Sr,Ba)_2SiO_4$) fluorescent materials that emit blue to red light, β-SiAlON fluorescent materials represented by $(Si,Al)_6(O,N)_8$:Eu that emit green light, sulfide fluorescent materials represented by $SrGa_2S_4$:Eu, nitride fluorescent materials such as CASN fluorescent materials represented by $CaAlSiN_3$:Eu and SCASN fluorescent materials represented by $(Sr,Ca)AlSiN_3$:Eu that emit red light, fluoride fluorescent materials such as KSF fluorescent materials represented by $K_2SiF_6$:Mn that emit red light, sulfide fluorescent materials that emit red light, and MGF (germinate-salt) fluorescent materials represented by $3.5MgO\cdot0.5MgF_2\cdot GeO_2$:Mn that emit red light.

In the present specification, standards according to Japan Industrial Standard JIS Z 8110 are applied to the relations between color names and chromaticity coordinates, the relations between wavelength ranges of light and color names of monochromatic lights, and the like, unless otherwise noted. Specifically, the wavelength range of a monochromatic light of 380 nm to 455 nm is the purple-blue range, 455 nm to 485 nm is the blue range, 485 nm to 495 nm is the blue-green range, 495 nm to 548 nm is the green range, 548 nm to 573 nm is the yellow-green range, 573 nm to 584 nm is the yellow range, 584 nm to 610 nm is the yellow-red range, and 610 nm to 780 nm is the red range.

Also, specifically, particles of a white pigment such as $TiO_2$ and $Al_2O_3$ can be used as the light-diffusing substance incorporated into the sealing resin 3. $TiO_2$ is particularly preferable because $TiO_2$ is comparatively stable toward water and the like and has a high refractive index and a good thermal conductivity.

The average grain diameter of particles of the light-diffusing substance contained in the sealing resin 3 is preferably in a range of 0.001 µm to 10 µm, so that light-scattering effects can be obtained efficiently. The average grain diameter of the particles of the light-diffusing substance in the sealing resin 3 is particularly preferably 0.001 µm to 0.05 µm. This constitution has good light-scattering effects, in other words, Rayleigh scattering effects, thereby further enhancing the light extraction efficiency of the light-emitting device 100.

The light extraction efficiency can be improved by a combination of the particles of the light-diffusing substance having an average grain diameter of, preferably, 0.001 µm to 0.05 µm and any of the above fluorescent materials, in particular, any of the nitride fluorescent materials such as CASN and SCASN fluorescent materials, fluoride fluorescent materials such as KSF fluorescent materials, and sulfide fluorescent materials. As the light extraction efficiency is improved, increase in temperature due to heat generated by the fluorescent material can be accordingly suppressed by reducing the quantity of the fluorescent material used. Hence, deterioration of the fluorescent material is reduced, thereby improving the reliability of the light-emitting device 100.

The wires 4 electrically connect the pad electrodes 132 of the n-side electrodes 13 and the pad electrodes 142 of the p-side electrodes 14 of the light-emitting elements 1 to the internal lead portions 21a and 22a of corresponding polarities. Au, Cu, Al, Ag, or alloys containing any of these metals as the main component can be suitably used.

The die-bonding resin 5 constitutes adhesive members for bonding the light-emitting elements 1 to the internal lead portion 21a on the bottom surface 23b of the recessed portion 23a.

As the die-bonding resin 5, a resin material that is less changed in color or less deteriorated by light and heat generated by the light-emitting elements 1 is preferably used. The resin material further preferably has a good light-transmitting property and a refractive index equal to or less than the refractive index of the sealing resin 3. If the refractive index of the die-bonding resin 5 is equal to or less than the refractive index of the sealing resin 3, light emitted from the light-emitting elements 1 through the die-bonding resin 5 can be efficiently extracted to the outside without being totally reflected by the interface between the die-bonding resin 5 and the sealing resin 3. A silicone die-bonding resin having a siloxane skeleton is preferably used as the resin material. Examples of the silicone die-bonding resin include silicone resins, silicone hybrid resins, and modified silicone resins.

Operation of Light-Emitting Device

Operation of the light-emitting device 100 will be described referring to FIG. 2A to FIG. 3B.

For ease of illustration, the following description is made on the assumption that the light-emitting elements 1 emit blue light and that the sealing resin 3 contains as the wavelength conversion member 6 particles of a fluorescent material that absorbs blue light and emits yellow light in the light-emitting device 100 according to the first embodiment.

When the light-emitting device 100 is connected to an external power supply via the external lead portions 21b and 22b, a current is supplied to the light-emitting elements 1 through the internal lead portions 21a and 22a and the wires 4, and the light-emitting elements 1 emit blue light. The blue light emitted from the light-emitting elements 1 is partly converted by the wavelength conversion member 6 into yellow light during propagation through the sealing resin 3. The light is emitted from the open side of the recessed portion 23a of the package 2 as white light that is the mixture of the blue light and the yellow light although the blue and yellow light is partly reflected and absorbed by interfaces between members including the light-emitting elements 1, the die-bonding resin 5, the internal lead portions 21a and 22a, the resin unit 23, and the sealing resin 3, which are disposed in the recessed portion 23a.

Figure 5A:
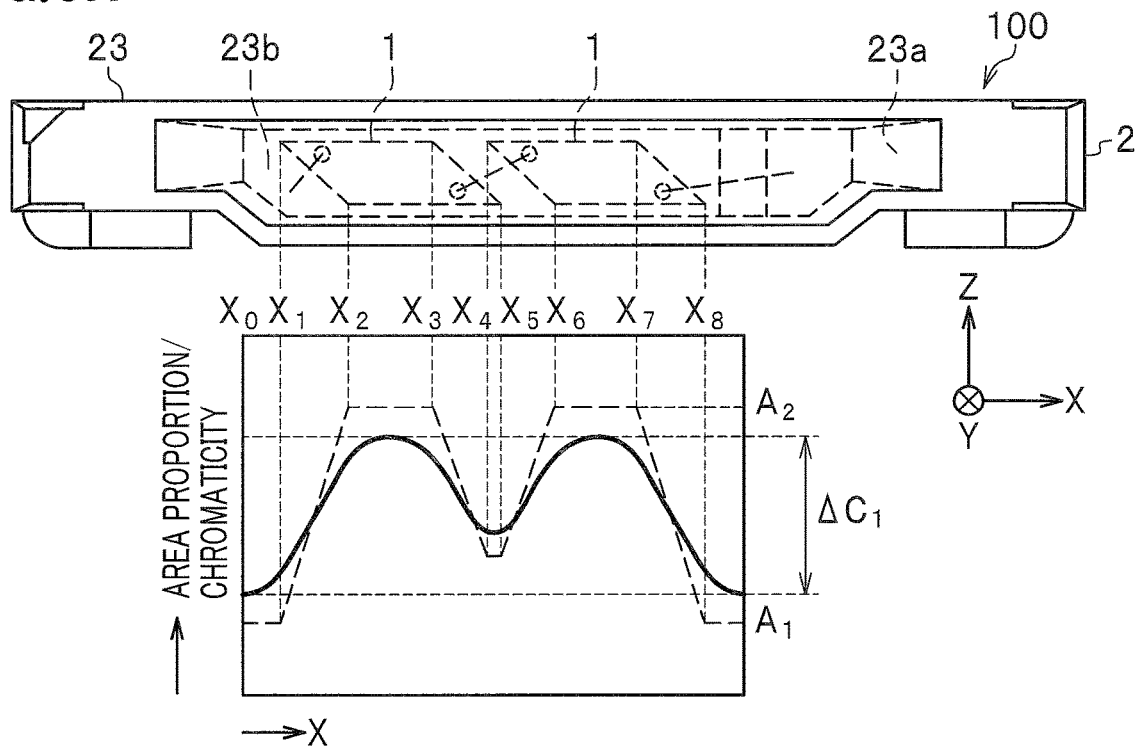
FIG. 5A includes a schematic front view of the light-emitting device according to the first embodiment and a graph showing chromatic changes in the width direction of the emitting surface and showing an area proportion of the light-emitting elements on the bottom surface of a recessed portion.
Figure 5B:
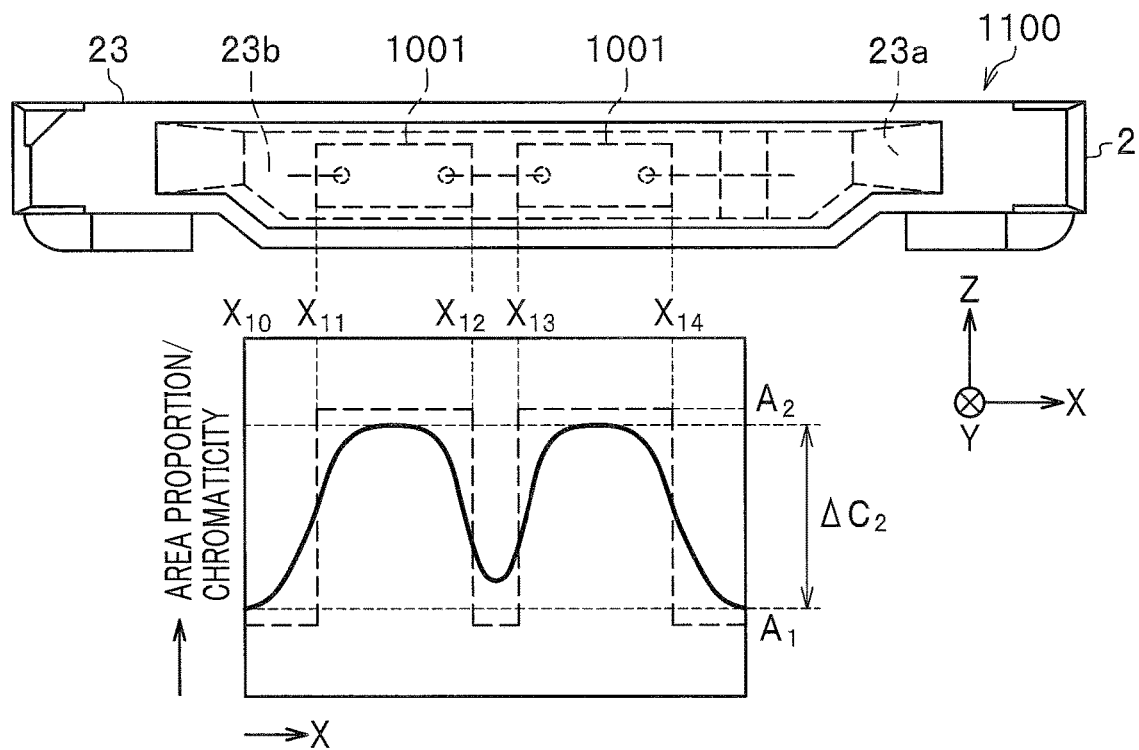
FIG. 5B includes a schematic front view of a light-emitting device according to a comparative example and a graph showing chromatic changes in the width direction of the emitting surface and showing an area proportion of light-emitting elements on the bottom surface of the recessed portion.

Unevenness in the longitudinal direction in the color of light emitted from the light-emitting device 100 will be described referring to FIG. 5A and FIG. 5B. FIG. 5A includes a schematic front view of the light-emitting device according to the first embodiment and a graph showing chromatic changes in the width direction of the emitting surface and showing an area proportion of the light-emitting elements on the bottom surface of the recessed portion. FIG. 5B includes a schematic front view of a light-emitting device according to a comparative example and a graph showing chromatic changes in the width direction of the emitting surface and showing an area proportion of light-emitting elements on the bottom surface of the recessed portion.

In each of the graphs in FIG. 5A and FIG. 5B, dashed lines indicate the area proportion of the light-emitting elements 1 in the thickness direction on the bottom surface 23b in the recessed portion 23a at positions in the X-axis direction, and solid lines indicate the average chromaticity in the thickness direction at positions in the X-axis direction. More specifically, the area proportion is the proportion of the length of the light-emitting elements 1 in the Z-axis direction to the length of the bottom surface 23b in the Z-axis direction. In the chromaticity graphs, the positive direction indicates bluish, and the negative direction indicates yellowish.

For ease of illustration, the following description is made on the assumption that the light-emitting elements 1 and light-emitting elements 1001 emit blue light, and the sealing resin 3 contains the wavelength conversion member 6 that absorbs blue light and emits yellow light in both of the light-emitting device 100 according to the first embodiment and a light-emitting device 1100 according to the comparative example.

Unevenness in the color, that is, unevenness in the chromaticity, of the light-emitting device 100 will be described here, but the same description applies to unevenness in luminance.

In the light-emitting device 1100 according to the comparative example, two light-emitting elements 1001 each having a rectangular outer shape in a front view are disposed instead of the light-emitting elements 1 each having a parallelogrammic outer shape in a front view in the light-emitting device 100. The long sides of the rectangular outer shape of the light-emitting elements 1001 have the same length as the long sides of the parallelogrammic outer shape of the light-emitting elements 1 and the lengths in the short direction of these elements are the same. Accordingly, the light-emitting elements 1 have the same area as the light-emitting elements 1001 in a front view. The light-emitting elements 1001 emit light in the same way as in the light-emitting device 100, and the light-emitting device 1100 emits white light that is the mixture of blue light and yellow light from the open side of the recessed portion 23a of the package 2.

In the light-emitting device 100, the wavelength conversion member 6 covers substantially the entire surfaces of the light-emitting elements 1 and substantially the entire portion of the bottom surface 23b of the recessed portion 23a on which the light-emitting elements 1 are not disposed. A part of blue light emitted from the front surfaces of the light-emitting elements 1 is extracted to the outside as the blue light itself, and another part of the blue light is extracted to the outside after being converted into yellow light by the wavelength conversion member 6 on the front surfaces of the light-emitting elements 1. Accordingly, the white light that is the mixture of the blue light and the yellow light is extracted from the regions in which the light-emitting elements 1 are disposed in a front view.

Blue light emitted from the lateral surfaces, in other words, surfaces facing the inner lateral surfaces of the recessed portion 23, of the light-emitting elements 1 is partly converted by the wavelength conversion member 6 disposed on the bottom surface 23b of the recessed portion 23a into yellow light. Accordingly, yellowish white light is extracted from the regions in which the light-emitting elements 1 are not disposed in a front view on the bottom surface 23b of the recessed portion 23a.

Hence, in the open side, which is the light-extracting surface of the light-emitting device 100, of the recessed portion 23a, bluish white light is emitted from the regions in which the light-emitting elements 1 are disposed in a front view, and yellowish white light is emitted from the other regions. As described above, in the case where the light-emitting device 100 is applied to a side-edge backlight including a light guide plate, colors are sufficiently mixed in the Z-axis direction, which is the thickness direction, but mixing the colors is difficult in the X-axis direction, which is the width direction. Hence, the chromaticity of emitted light in the thickness direction of the light-emitting device 100 is averaged, and unevenness in color in the width direction is considered.

In the case where the chromaticity is averaged in the thickness direction, the chromaticity in the X-axis direction, which is the longitudinal direction of the bottom surface 23*b* of the recessed portion 23*a* and the width direction of the light-emitting device 100, is determined by the proportion of the area of the light-emitting elements 1 to the whole area of the bottom surface 23*b* of the recessed portion 23*a*, in other words, the area proportion of the light-emitting elements 1.

The area proportion is the largest when the length of the light-emitting element 1 in the Z-axis direction is the largest if the length of the bottom surface 23*b* in the Z-axis direction is constant. This largest area proportion is represented by $A_2$. The area proportion is the smallest in the regions in which the light-emitting elements 1 are not disposed. This smallest area proportion is represented by $A_1$.

In the light-emitting device 100 according to the first embodiment, the light-emitting elements 1 are not disposed in a region from a position $X_0$ to a position $X_1$ and in a region on the right side of a position $X_8$ in the X-axis direction, and the area proportion has the minimum value $A_1$ in these regions. In a region from a position $X_2$ to a position $X_3$ and a region from a position $X_6$ to a position $X_7$, the area proportion has the maximum value $A_2$. Regions from the position $X_1$ to the position $X_2$, the position $X_3$ to a position $X_4$, a position $X_5$ to the position $X_6$, and the position $X_7$ to the position $X_8$ include the inclined sides of the light-emitting elements 1 with respect to the X axis in a front view, and the area proportion gradually changes according to the changes in the length of the light-emitting elements 1 in the Z-axis direction. In a region from the position $X_4$ to the position $X_5$ including the inclined sides of the light-emitting elements 1 in a front view, increase and decrease in the area proportion of the two respective light-emitting elements 1 are cancelled out, and the area proportion in this region has a constant value larger than $A_1$.

In the light-emitting device 1100 according to the comparative example, the light-emitting elements 1001 are not disposed in a region from a position $X_{10}$ to a position $X_{11}$, a region from a position $X_{12}$ to a position $X_{13}$, and a region on the right side of a position $X_{14}$ in the X-axis direction, and the area proportion in these regions has the minimum value $A_1$. In a region from the position $X_{11}$ to the position $X_{12}$ and a region from the position $X_{13}$ to the position $X_{14}$, the area proportion has the maximum value $A_2$. Since the light-emitting elements 1001 are rectangular, the area proportion does not gradually change in any region.

In both of the light-emitting device 100 and the light-emitting device 1100, the chromaticity indicates a bluish color when the area proportion has the maximum value $A_2$, and indicates a yellowish color when the area proportion has the minimum value $A_1$. Light emitted from the front surfaces of the light-emitting elements 1 includes not only beams propagating perpendicularly to the front surfaces but beams propagating at some angles to the front surfaces. In addition, the fluorescent material emits diffused light. Accordingly, components of light are mixed near the outer edges of the regions in which the light-emitting elements 1 are disposed in a front view. Hence, the chromaticity tends to change more gradually than the area proportion changes.

In the light-emitting device 1100 that includes the light-emitting elements 1001 each having a rectangular outer shape, the area proportion changes abruptly, and the chromaticity therefore changes abruptly. Hence, the contrast in chromaticity between the regions in which the light-emitting elements 1001 are disposed and the regions in which the light-emitting elements 1001 are not disposed is strong. In other words, a variation width $\Delta C_2$ of the chromaticity that indicates the magnitude of unevenness in the color of the light-emitting device 1100 is large.

On the other hand, in the light-emitting device 100 that includes the light-emitting elements 1 each having a parallelogrammic outer shape, the area proportion changes more gradually than in the light-emitting device 1100, and the variation width $\Delta C_1$ of the chromaticity is smaller than in the light-emitting device 1100.

In particular, since the right and left sides of the outer shapes of the light-emitting elements 1 are not perpendicular but inclined, the lengths in both right and left end portions of the light-emitting elements 1 in the Z-axis direction gradually decrease from the lengths of their central portions of the light-emitting elements 1 in the Z-axis direction, thereby suppressing abrupt changes in chromaticity. In addition, the effects of mixing of light from the light-emitting elements 1 and light from the fluorescent material can further reduce unevenness in color as described above. It is preferable that the sides facing each other of the two light-emitting elements 1 be inclined with respect to the longitudinal direction of the bottom surface 23*b* and be disposed near to each other. The two light-emitting elements 1 are more preferably disposed so that orthographic projections of these sides onto the X axis, which is parallel to the longitudinal direction of the bottom surface 23*b*, will overlap each other. This constitution can more effectively reduce unevenness in color between the two light-emitting elements 1.

The number of the light-emitting elements 1 mounted is two in the present embodiment, but the number can be equal to or more than three. It does not matter whether the emission colors of the light-emitting elements are the same or differ from each other. In the case where equal to or more than three light-emitting elements 1 are mounted, it is preferable that all the light-emitting elements 1 be aligned along the longitudinal direction of the bottom surface 23*b* and that two adjacent light-emitting elements 1 be disposed so that their sides inclined with respect to the longitudinal direction of the bottom surface 23*b* will face each other in a front view. An example of a light-emitting device including equal to or more than three light-emitting elements will be described later as another embodiment.

Method for Manufacturing Light-Emitting Device

Figure 6:
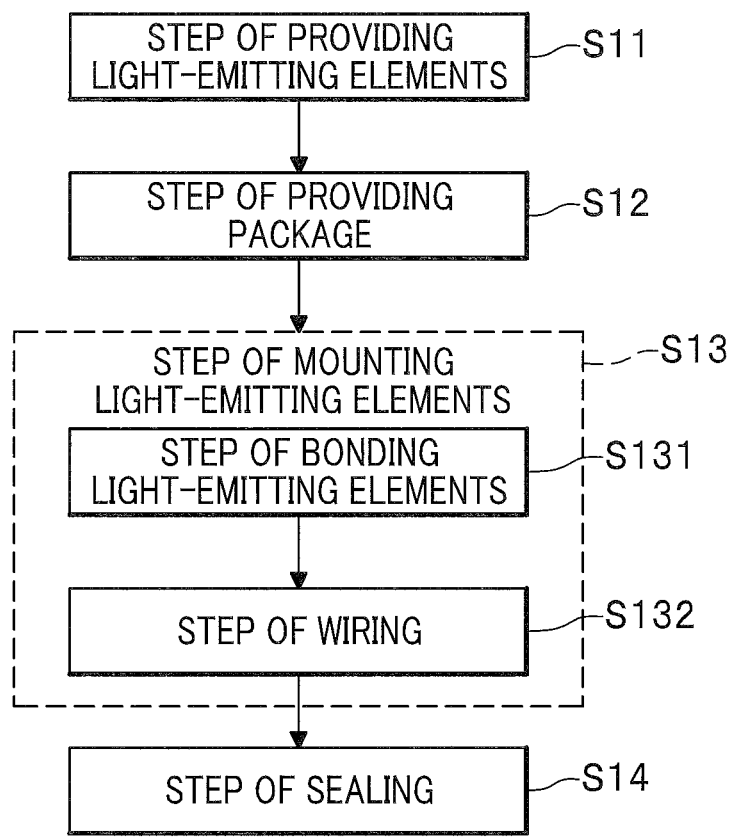
FIG. 6 is a flowchart illustrating a method for manufacturing the light-emitting device according to the first embodiment.
Figure 7A:
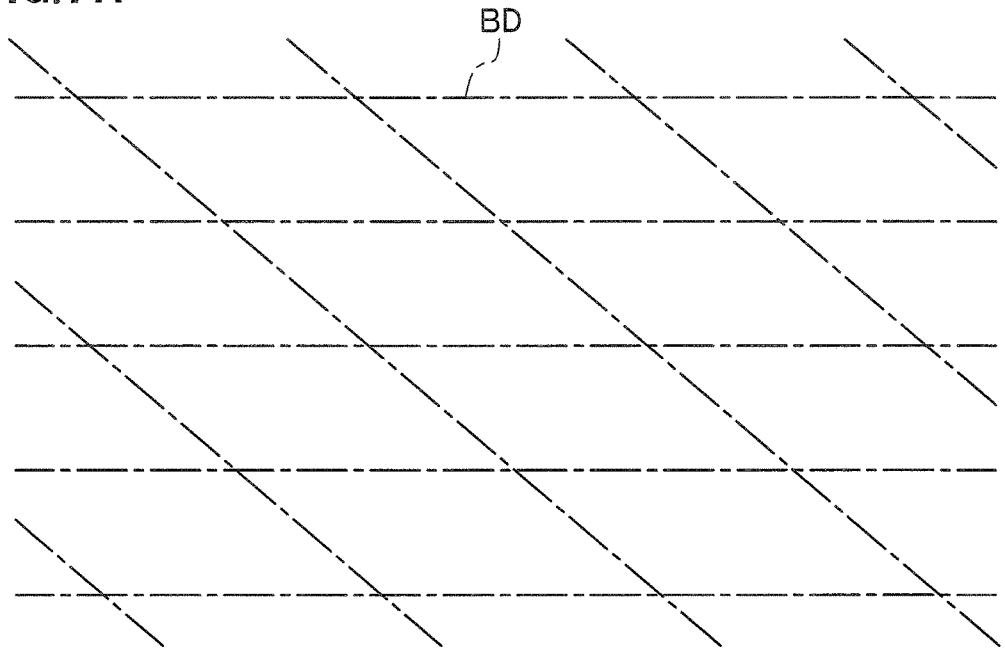
FIG. 7A is a schematic plan view for illustrating borders that imaginarily divide a wafer in a step of providing light-emitting elements in the method for manufacturing the light-emitting device according to the first embodiment.
Figure 7B:
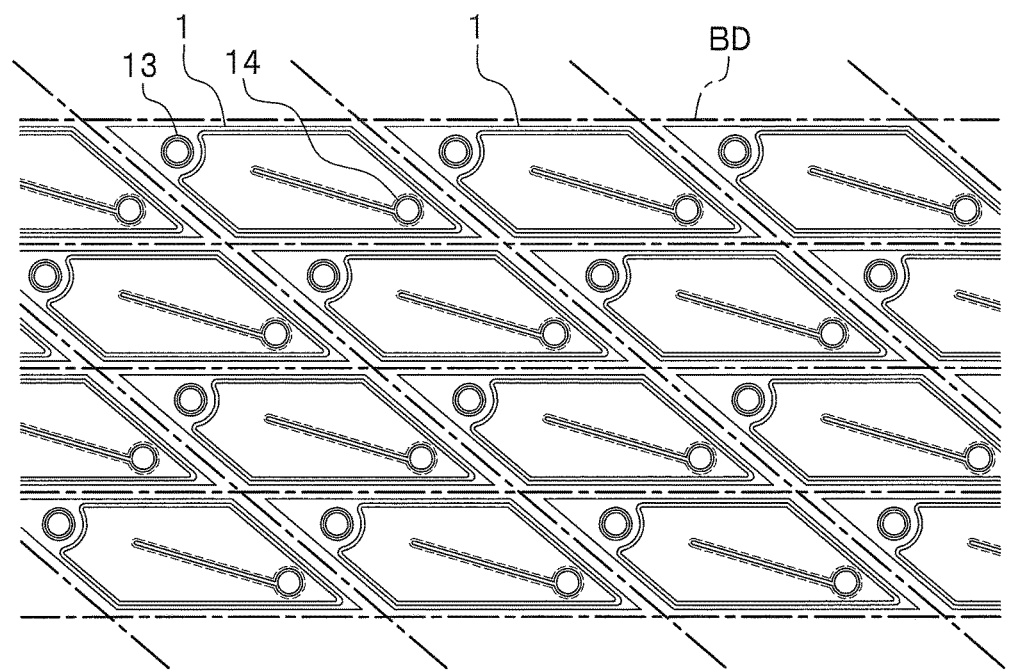
FIG. 7B is a schematic plan view of light-emitting elements formed on the wafer in the step of providing light-emitting elements in the method for manufacturing the light-emitting device according to the first embodiment.
Figure 8A:
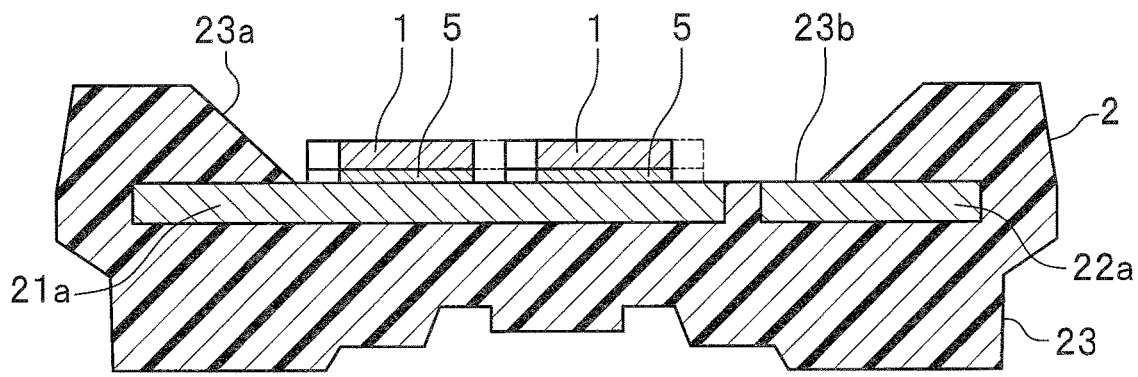
FIG. 8A is a schematic cross-sectional view for illustrating a step of bonding the light-emitting elements in the method for manufacturing the light-emitting device according to the first embodiment.
Figure 8B:
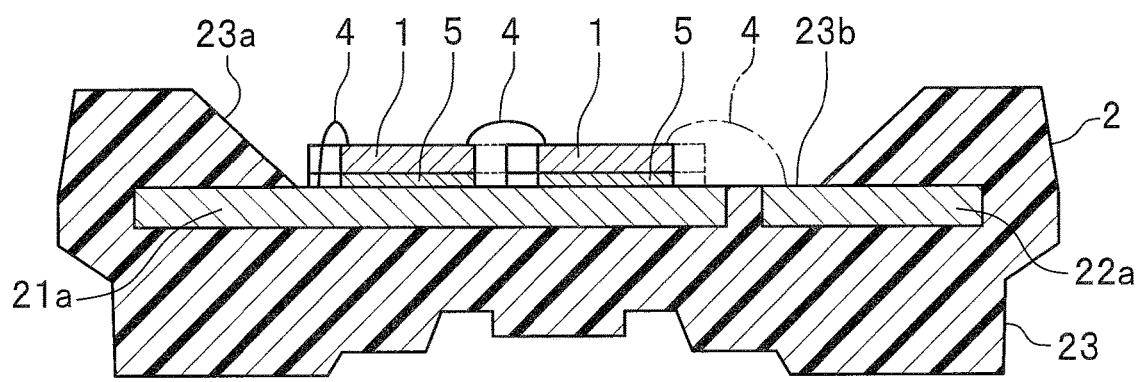
FIG. 8B is a schematic cross-sectional view for illustrating a step of wiring in the method for manufacturing the light-emitting device according to the first embodiment.
Figure 8C:
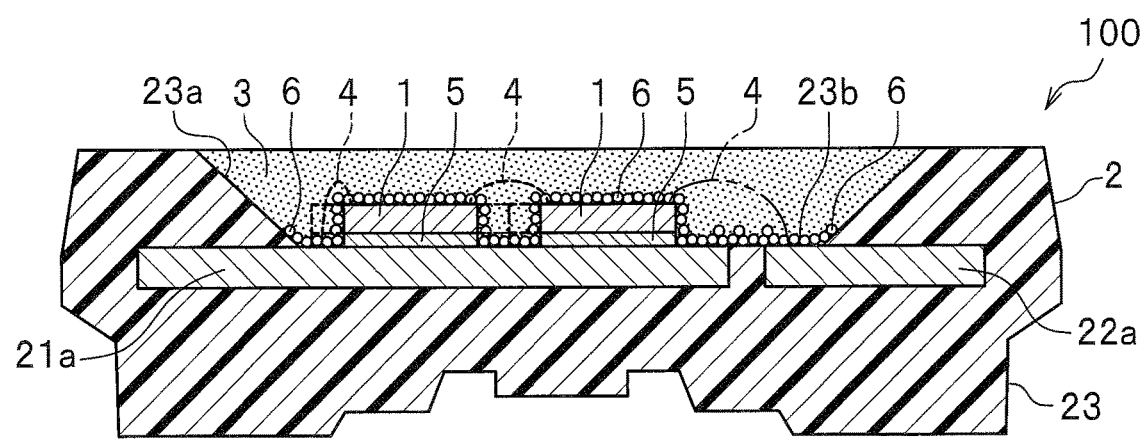
FIG. 8C is a schematic cross-sectional view for illustrating a step of sealing in the method for manufacturing the light-emitting device according to the first embodiment.

A method for manufacturing the light-emitting device 100 will be described referring to FIG. 6 to FIG. 8C. FIG. 6 is a flowchart illustrating the method for manufacturing the light-emitting device according to the first embodiment. FIG. 7A is a schematic plan view for illustrating borders that imaginarily divide a wafer in a step of providing light-emitting elements in the method for manufacturing the light-emitting device according to the first embodiment. FIG. 7B is a schematic plan view of light-emitting elements formed on the wafer in the step of providing light-emitting elements in the method for manufacturing the light-emitting device according to the first embodiment. FIG. 8A is a schematic cross-sectional view for illustrating a step of bonding the light-emitting elements in the method for manufacturing the light-emitting device according to the first embodiment. FIG. 8B is a schematic cross-sectional view for illustrating a step of wiring in the method for manufacturing the light-emitting device according to the first embodiment. FIG. 8C is a schematic cross-sectional view for illustrating a step of sealing in the method for manufacturing the light-emitting device according to the first embodiment.

In FIG. 7A and FIG. 7B, a "plan view" is taken from the direction of a normal line to the main surface of the wafer. Hence, an up-and-down directions refers to the directions perpendicular to the main surface of the wafer in the description of step S11 of providing light-emitting elements below. FIG. 8A to FIG. 8C illustrate a cross section at a position corresponding to the line IIIA-IIIA in FIG. 2A.

(Method for Manufacturing Light-Emitting Device)

The method for manufacturing the light-emitting device 100 according to the first embodiment includes step S11 of providing light-emitting elements, step S12 of providing a package, step S13 of mounting the light-emitting elements, and step S14 of sealing. Step S13 of mounting the light-emitting elements includes step S131 of bonding the light-emitting elements and step S132 of wiring.

In step S11 of providing light-emitting elements, singulated light-emitting elements 1 having the constitution shown in FIG. 4A and FIG. 4B are provided.

The following describes illustrative steps for manufacturing the light-emitting elements 1 in wafer-level process, but these steps are not limiting. In manufacturing the light-emitting elements 1 in wafer-level process, for example, imaginary borders BD that demarcate individual light-emitting elements 1 are established as shown in FIG. 7A, and a plurality of light-emitting elements 1 each having the same shape are formed.

(Forming Semiconductor Layered Body)

Specifically, the semiconductor layered body 12, in which the n-type semiconductor layer 12n, the active layer 12a, and the p-type semiconductor layer 12p are layered successively, is first formed on the substrate 11 of sapphire or the like using the above semiconductor material by the MOCVD method or the like. The p-type semiconductor layer 12p is then annealed to form the p-type layer.

(Exposing n-Type Semiconductor Layer)

After forming the semiconductor layered body 12, on part of the surface of the semiconductor layered body 12, whole of the p-type semiconductor layer 12p and the active layer 12a, and part of the n-type semiconductor layer 12n are removed by etching from the upper side to form the stepped portion 12b in which the n-type semiconductor layer 12n is exposed on the bottom surface.

(Forming Insulating Film)

Next, the insulating film 15 is formed using an insulating material such as SiO$_2$ by sputtering or the like in the region in which the p-side pad electrode 142 is to be disposed and in a region near that region on the upper surface of the p-type semiconductor layer 12p.

(Forming Light-Transmissive Electrode)

After that, the light-transmissive electrode 141 is formed using a light-transmissive electrically-conductive material such as ITO by sputtering or the like to cover substantially the entire upper surface of the p-type semiconductor layer 12p.

(Forming p-Side Pad Electrode)

In addition, the pad electrode 142 is formed using a metal material such as Cu and Au by sputtering or the like on part of the upper surface of the light-transmissive electrode 141, so that the p-side electrode 14 is formed.

(Forming n-Side Pad Electrode)

Also, the light-reflective film 131 is formed using a metal material such as Al having a good light-reflecting property by sputtering or the like on the stepped portion 12b, and the pad electrode 132 is formed using a metal material such as Cu and Au by sputtering or the like on the upper surface of the light-reflective film 131, so that the n-side electrode 13 is formed.

Either of the n-side electrode 13 and the p-side electrode 14 may be formed earlier. Some substeps such as forming the pad electrode 132 and forming the pad electrode 142 may be performed at the same time.

(Forming Protective Film)

The protective film 16 is then formed using a light-transmissive insulating material such as SiO$_2$ by sputtering or the like to cover the whole wafer except for the regions to be connected to the outside on the upper surfaces of the pad electrode 132 and the pad electrode 142 so that the openings 16n and 16p will be formed.

The insulating film 15, the protective film 16, and the layers constituting the n-side electrode 13 and the p-side electrode 14, can each be patterned by forming a mask having an appropriate shape by photolithography and performing etching or lift-off using the mask.

The light-emitting elements 1 in the wafer state shown in FIG. 7B can be formed by performing the above substeps.

(Singulating)

Next, the wafer is cut along the borders BD to singulate the light-emitting elements 1.

If the light-emitting elements 1 each have a parallelogrammic outer shape, a plurality of light-emitting elements 1 can be densely formed on one wafer, and singulation can be performed on the wafer only by linear cutting by dicing with a dicing saw or scribing.

Before the wafer is cut, the thickness of the substrate 11 may be reduced by polishing its back surface. This reduction facilitates cutting of the wafer.

Also in the case of a trapezoidal or triangular outer shape of the light-emitting element 1, sections with that shape can be densely laid out on the wafer, and singulation can be performed only by linear cutting as in the case of a parallelogram. In the case of a pentagon or hexagon outer shape of the light-emitting element 1, singulation may not be performed only by linear cutting if sections with that shape are laid out so that the area will be efficiently used. In this case, singulation can be performed by laser dicing, which enables zigzag cutting.

In laser dicing, laser light (preferably femtosecond pulsed laser) is applied so as to be focused on a point within the substrate 11 to change in quality the portion of the substrate 11 near the focus, thereby forming grooves for cutting. The grooves for cutting along polygonal lines can be formed within the substrate 11 by irradiating the substrate 11 with the laser light along the borders BD. After that, a stress is applied to the substrate 11 with, for example, a roller, so that singulation from the wafer can be achieved starting from the grooves for cutting formed along the borders BD.

Further descriptions of the method for cutting the wafer into a non-rectangular shape by laser dicing are omitted because the method is described in, for example, Japanese Unexamined Patent Application Publication No. 2006-135309 in detail.

In step S12 of providing a package, the package 2 in the light-emitting device 100 shown in FIG. 1 to FIG. 3B is provided. In the package 2 provided in this step, the light-emitting elements 1 are not mounted, and the sealing resin 3 is not disposed.

In step S12 of providing a package, the package 2 may be manufactured by, for example, molding with molds, such as transfer molding, injection molding, compression molding, and extrusion, or a commercially available package may be provided.

Either of step S11 of providing light-emitting elements and step S12 of providing a package may be performed earlier. The steps may be performed in parallel.

An illustrative method for manufacturing the package 2 will be described. The package 2 can be manufactured by sandwiching a lead frame (lead electrodes 21 and 22) formed by punching a metal sheet between upper and lower molds forming a cavity that has the shape of the resin unit 23, injecting a resin material through a gate hole formed in part of the molds, solidifying or curing the injected resin material, and removing the resulting product from the molds. In the case where a plurality of packages 2 connected with each other via the lead frame are manufactured, the packages 2 are singulated by cutting the lead frame.

Further descriptions of the method for manufacturing the package with molds are omitted because the method is described in, for example, Japanese Unexamined Patent Application Publication No. 2008-72074 in detail.

In step S13 of mounting the light-emitting elements, the light-emitting elements 1 provided in step S11 of providing light-emitting elements are mounted in the recessed portion 23a of the package 2 provided in step S12 of providing a package. More specifically, step S13 of mounting the light-emitting elements includes step S131 of bonding the light-emitting elements and step S132 of wiring as substeps.

First, in step S131 of bonding the light-emitting elements, the light-emitting elements 1 are bonded to the upper surface of the internal lead portion 21a, which constitutes the bottom surface 23b of the recessed portion 23a of the package 2, using the die-bonding resin 5 (preferably a silicone die-bonding resin). At this time, a proper quantity of die-bonding resin 5 is supplied to portions to be bonded of the upper surface of the internal lead portion 21a using a dispenser or by pin transfer. The light-emitting elements 1 are then transferred to the above portions to be bonded on which the die-bonding resin 5 has been disposed, with the surfaces having the n-side electrodes 13 and the p-side electrodes 14 facing up, using a die collet or the like. The surfaces on the substrate 11 are bonded to the upper surface of the internal lead portion 21a so that the long sides, which lie along the longitudinal direction of the light-emitting elements 1, of the parallelogrammic outer shapes will be parallel to the longitudinal direction of the bottom surface 23b of the recessed portion 23a.

The two light-emitting elements 1 are aligned in the longitudinal direction of the bottom surface 23b so that short sides of the parallelogrammic outer shapes, will face and be at a predetermined distance away from each other.

Next, in step S132 of wiring, the wires 4 are disposed to electrically connect the p-side electrode 14 of the left-hand light-emitting element 1 to the upper surface of the internal lead portion 21a of the lead electrode 21, the n-side electrode 13 of the left-hand light-emitting element 1 to the p-side electrode 14 of the right-hand light-emitting element 1, and the n-side electrode 13 of the right-hand light-emitting element 1 to the upper surface of the internal lead portion 22a of the lead electrode 22, respectively. The wires 4 can be disposed using a wire bonder.

Next, in step S14 of sealing, an uncured sealing resin 3 is charged into the recessed portion 23a of the package 2 by potting or the like, and the sealing resin 3 is cured, so that the light-emitting elements 1 are sealed. The sealing resin 3 may contain particles of the wavelength conversion member 6 and a light-diffusing substance in a light-transmissive resin.

In step S14 of sealing, the package 2 is put so that the open side of the recessed portion 23a will face up vertically.

In the case where the sealing resin 3 contains the wavelength conversion member 6, after the uncured resin material is supplied into the recessed portion 23a, the wavelength conversion member 6 is preferably allowed to sediment toward the light-emitting elements 1 and the bottom surface 23b before the resin material is cured. Concentrating the wavelength conversion member 6 densely near the surfaces of the light-emitting elements 1 and the bottom surface 23b of the recessed portion 23a can enhance the efficiency of wavelength conversion of light from the light-emitting elements 1 by the wavelength conversion member 6. The enhanced wavelength conversion efficiency allows for reduction in the content of the wavelength conversion member 6.

The light-emitting device 100 can be manufactured by the above procedure.

Second Embodiment

Figure 9A:
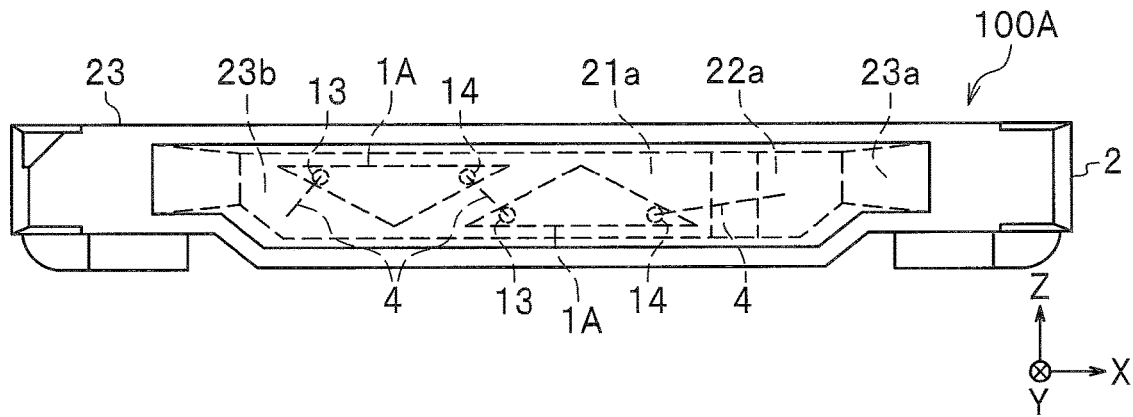
FIG. 9A is a schematic front view for illustrating a constitution of a light-emitting device according to a second embodiment.

A light-emitting device according to a second embodiment will be described referring to FIG. 9A. FIG. 9A is a schematic front view for illustrating a constitution of the light-emitting device according to the second embodiment.

A light-emitting device 100A according to the second embodiment includes two light-emitting elements 1A each having a triangular outer shape instead of the two light-emitting elements 1 each having a parallelogrammic outer shape in the light-emitting device 100 according to the first embodiment.

More specifically, the outer shape of the light-emitting elements 1A is an isosceles triangle that has a base longer than the other two sides. Hence, the bases of the isosceles triangles of the light-emitting elements 1A lie along the longitudinal direction. The light-emitting elements 1A are disposed so that their bases extending in the longitudinal direction of their outer shape will be parallel to the longitudinal direction of the bottom surface 23b of the recessed portion 23a. The apex of the triangular outer shape of one of the two light-emitting elements 1A faces up, and the apex of the other light-emitting element 1A faces down. One side of the triangular outer shape of one of the two light-emitting elements 1A faces and is at a predetermined distance away from one side of the other light-emitting element 1A, and orthographic projections of the sides facing each other onto the X axis, which is parallel to the longitudinal direction of the bottom surface 23b, overlap each other. Hence, unevenness in the luminance and the color of emitted light in the longitudinal direction of the bottom surface 23b in the light-emitting device 100A can be reduced.

The external connecting portions of the n-side electrode 13 and the p-side electrode are respectively disposed near the two base angles of each of the light-emitting elements 1A. Since the light-emitting elements 1A have external connecting portions of the electrodes near the corners, the regions for connecting the wires 4 can be reduced in the longitudinal direction of the bottom surface 23b if the wires 4 extend from the external connecting portions in the short direction of the bottom surface 23b across the nearby sides.

The outer shape of the light-emitting elements 1A is not limited to an isosceles triangle but may be a regular triangle or a triangle having three different sides.

The light-emitting device 100A according to the second embodiment differs from the light-emitting device 100 according to the first embodiment only in the outer shape of the light-emitting elements 1A. The light-emitting device 100A therefore can operate and be manufactured in the same manner as the light-emitting device 100. Thus, their detailed descriptions are omitted.

Third Embodiment

Figure 9B:
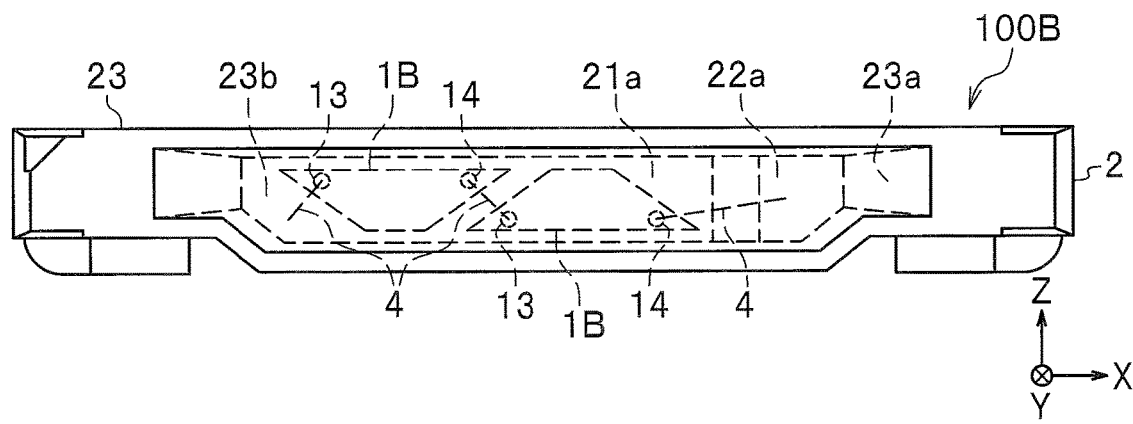
FIG. 9B is a schematic front view for illustrating a constitution of a light-emitting device according to a third embodiment.

A light-emitting device according to a third embodiment will be described referring to FIG. 9B. FIG. 9B is a schematic front view for illustrating a constitution of the light-emitting device according to the third embodiment.

A light-emitting device 100B according to the third embodiment includes two light-emitting elements 1B each having a trapezoidal outer shape instead of the two light-emitting elements 1 each having a parallelogrammic outer shape in the light-emitting device 100 according to the first embodiment.

In the present specification, unless otherwise noted, a "trapezoidal" shape of the light-emitting elements 1B in a front view does not include rectangles or parallelograms. That is, at least one base angle of the trapezoid is not a right angle, and the opposite angles are not equal to each other.

The two light-emitting elements 1B are disposed so that one leg constituting the base angle that is not a right angle of the trapezoid of one of the light-emitting elements 1B, that is, a side inclined with respect to the longitudinal direction of the bottom surface 23b, will face an inclined side of the other light-emitting element 1B. The outer shapes of the two light-emitting elements 1B are preferably congruent with each other so that a high bilateral symmetry can be obtained, but this constitution is not limiting. The legs facing each other may be inclined at different angles.

The light-emitting elements 1B each have an isosceles trapezoidal outer shape, which has the same two base angles on the lower-base side and two legs with the same length, in a front view. The bases of the two light-emitting elements 1B are all parallel to the X-axis direction, which is the longitudinal direction of the bottom surface 23b of the recessed portion 23a, and the orientations of the light-emitting elements 1B are opposite to each other so that the shorter base of the trapezoid of one of the light-emitting elements 1B will be the lower base and the longer base of the trapezoid of the other light-emitting element 1B will be the lower base.

Legs, which are not perpendicular, of the trapezoidal outer shapes of the two light-emitting elements 1B are at a predetermined distance away from and face each other, and orthographic projections of the legs facing each other onto the X axis, which is parallel to the longitudinal direction of the bottom surface 23b, overlap each other. Hence, unevenness in the luminance and the color of emitted light in the longitudinal direction of the bottom surface 23b in the light-emitting device 100B can be reduced.

The external connecting portions of the n-side electrode 13 and the p-side electrode are respectively disposed near the two base angles at the longer base of each of the light-emitting elements 1B. Hence, the regions for connecting the wires 4 can be reduced in the longitudinal direction of the bottom surface 23b if the wires 4 extend from the external connecting portions in the short direction across the nearby legs.

The light-emitting device 100B according to the third embodiment differs from the light-emitting device 100 according to the first embodiment only in the outer shape of the light-emitting elements 1B. The light-emitting device 100B therefore can operate and be manufactured in the same manner as the light-emitting device 100. Thus, their detailed descriptions are omitted.

Fourth Embodiment

Figure 9C:
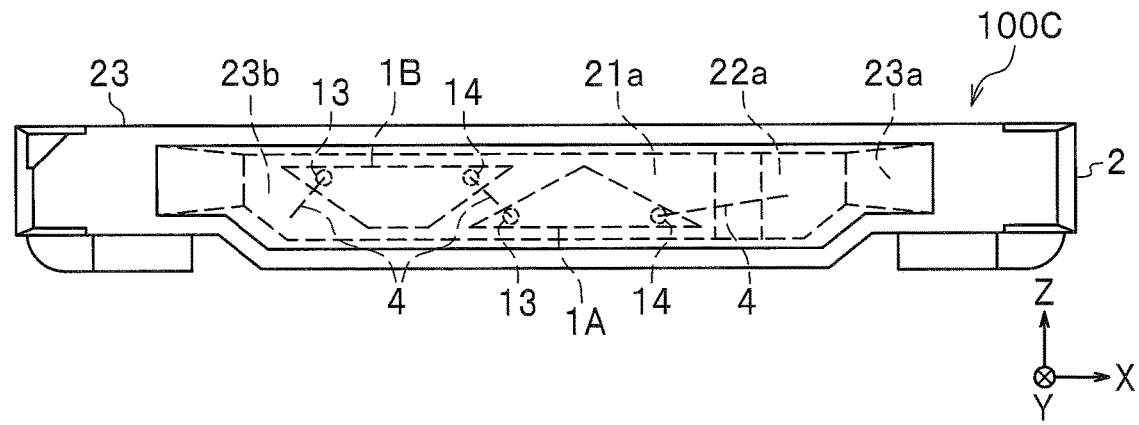
FIG. 9C is a schematic front view for illustrating a constitution of a light-emitting device according to a fourth embodiment.

A light-emitting device according to a fourth embodiment will be described referring to FIG. 9C. FIG. 9C is a schematic front view for illustrating a constitution of the light-emitting device according to the fourth embodiment.

A light-emitting device 100C according to the fourth embodiment includes the light-emitting element 1A having a triangular outer shape and the light-emitting element 1B having a trapezoidal outer shape instead of the two light-emitting elements 1 each having a parallelogrammic outer shape in the light-emitting device 100 according to the first embodiment.

Every one of the light-emitting devices 100, 100A, and 100B according to the above embodiments includes the two light-emitting elements 1, 1A, or 1B having the same outer shape, but light-emitting elements having different outer shapes can be combined as in the light-emitting device 100C according to the fourth embodiment.

Also in the case where the light-emitting element 1A and the light-emitting element 1B having different outer shapes are used, the sides facing each other in a front view are substantially parallel to each other with a predetermined distance existing between the sides. In this case, orthographic projections of the sides facing each other of the light-emitting elements 1A and 1B onto the X axis, which is parallel to the longitudinal direction of the bottom surface 23b, preferably overlap each other. This constitution can reduce unevenness in the luminance and the color of emitted light in the longitudinal direction of the bottom surface 23b in the light-emitting device 100C.

The light-emitting device 100C according to the fourth embodiment differs from the light-emitting device 100 according to the first embodiment only in the outer shapes of the light-emitting elements 1A and 1B. The light-emitting device 100C therefore can operate and be manufactured in the same manner as the light-emitting device 100. Thus, their detailed descriptions are omitted.

The combination of the outer shapes of the light-emitting elements is not limited to a trapezoid and a triangle, but may be a parallelogram and a triangle, a parallelogram and a trapezoid, or other polygons other than rectangles.

Fifth Embodiment

Figure 10A:
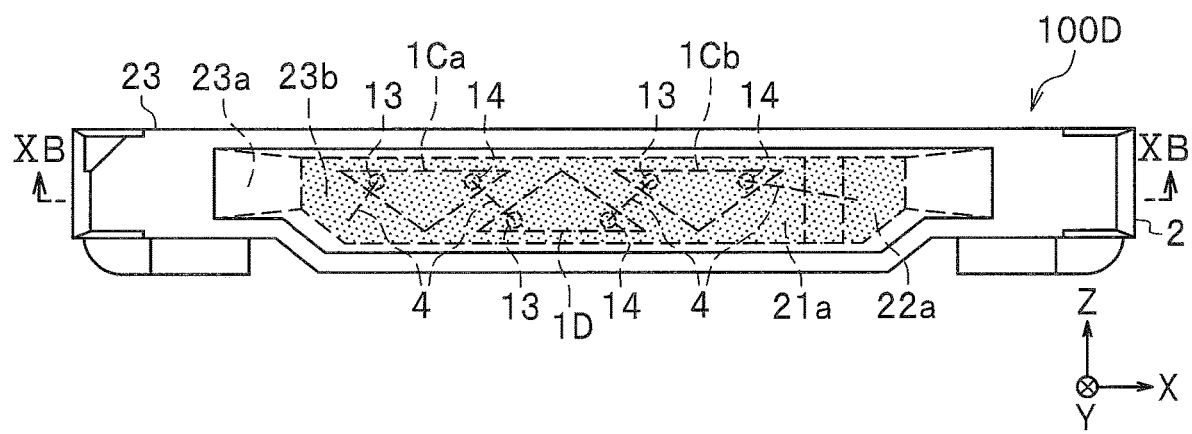
FIG. 10A is a schematic front view for illustrating a constitution of a light-emitting device according to a fifth embodiment.
Figure 10B:
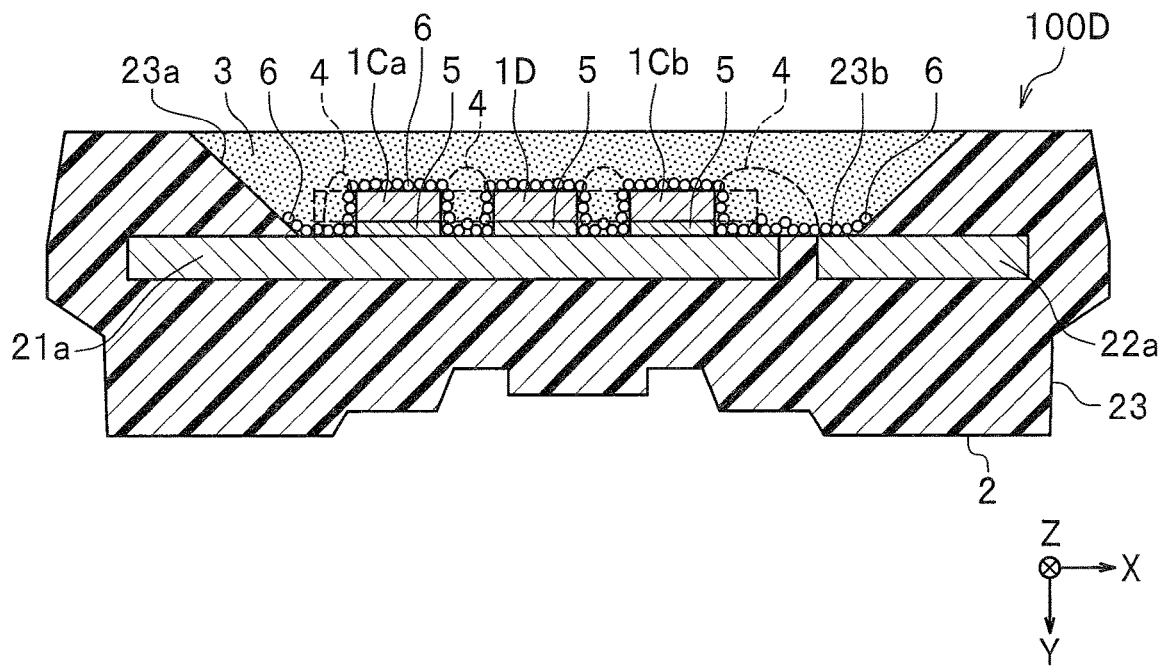
FIG. 10B is a schematic cross-sectional view for illustrating the constitution of the light-emitting device according to the fifth embodiment taken along the line XB-XB in FIG. 10A.
Figure 11:
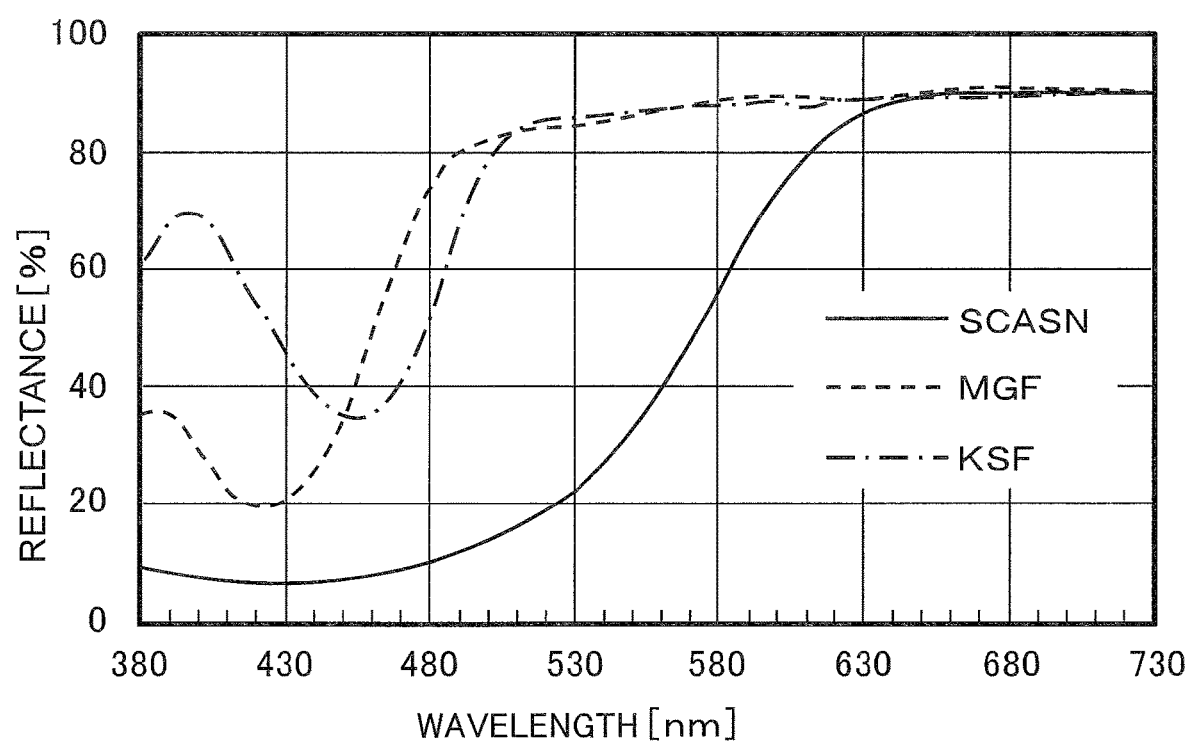
FIG. 11 is a graph showing reflection spectra of fluorescent materials used in the light-emitting device according to the fifth embodiment.

A light-emitting device according to a fifth embodiment will be described referring to FIG. 10A to FIG. 11. FIG. 10A is a schematic front view for illustrating a constitution of the light-emitting device according to the fifth embodiment. FIG. 10B is a schematic cross-sectional view for illustrating the constitution of the light-emitting device according to the fifth embodiment taken along the line XB-XB in FIG. 10A. FIG. 11 is a graph showing reflection spectra of fluorescent materials used in the light-emitting device according to the fifth embodiment.

In FIG. 10A showing the front view, the region including the wavelength conversion member 6 is indicated by dot-hatching.

A light-emitting device 100D according to the fifth embodiment includes light-emitting elements 1Ca, 1Cb, and 1D each having a triangular outer shape instead of the two light-emitting elements 1 each having a parallelogrammic outer shape in the light-emitting device 100 according to the first embodiment. The three light-emitting elements 1Ca, 1Cb, and 1D have substantially the same outer shape in a front view and are aligned in a row in the longitudinal direction of the bottom surface 23b on the bottom surface 23b so that the apexes of the triangular outer shapes will alternately face up and down. The light-emitting element 1D disposed at the center emits green light, and the light-emitting elements 1Ca and 1Cb on both sides emit blue light. The sealing resin 3 contains the wavelength conversion member 6 that mainly absorbs part of the blue light from the light-emitting elements 1Ca and 1Cb and emits red light. The wavelength conversion member 6 is concentrated near the bottom surface 23b of the recessed portion 23a and the surfaces of the light-emitting elements 1Ca, 1Cb, and 1D.

In the light-emitting devices 100 to 100C according to the above embodiments, the light-emitting elements 1 to 1B all emit blue light, the wavelength conversion member 6 contained in the sealing resin 3 converts part of the blue light into yellow or red light, and the color of the converted light is mixed with the color of the light from the light-emitting elements 1 to 1B, so that white light is generated. On the other hand, the light-emitting device 100D according to the fifth embodiment employs the light-emitting element 1D that emits green light instead of generating a green light component with a fluorescent material. The green light emitted from the light-emitting element 1D, which is an LED, generally has a narrower emission wavelength range in the emission spectrum than that range of green light emitted from a fluorescent material. Hence, the color purities of primary colors of blue and red obtained through blue and red color filters that are used in color image display devices and the like including liquid-crystal display elements can be improved. Accordingly, using the light-emitting device 100D as a backlight for such a color image display device can expand the color reproduction range of the color image display device.

Also, disposing the light-emitting element 1D that emits green light, which has a relatively high luminosity factor, at the center and disposing the light-emitting elements 1Ca and 1Cb that emit blue light, which has a relatively low luminosity factor, on both sides facilitate balancing of the light quantities of different colors. In addition, this arrangement enhances the bilateral symmetry and reduces unevenness in color.

At least a material that emits red light is used as the wavelength conversion member 6 incorporated in the sealing resin 3, as described above. Examples of the fluorescent material that emits red light include KSF fluorescent materials, MGF fluorescent materials, and SCASN fluorescent materials, as described above. Fluorescent materials that emit red light absorb light having wavelengths shorter than their emission wavelengths. Hence, some of these fluorescent materials absorb green light from the light-emitting element 1D in addition to blue light from the light-emitting elements 1Ca and 1Cb. The fluorescent materials that absorb green light convert green light into red light, but its conversion efficiency is lower than the conversion efficiency of blue light into red light. Hence, the emission efficiency of the light-emitting device 100D as a whole decreases.

A SCASN fluorescent material indicated by the solid line in FIG. 11 has a low reflectance of green light at wavelengths of about 530 nm. In other words, the SCASN fluorescent material absorbs much green light. On the other hand, an MGF fluorescent material indicated by the dashed line and a KSF fluorescent material indicated by the dot-dash line have high reflectances of green light at wavelengths of about 530 nm. In other words, the MGF fluorescent material and the KSF fluorescent material absorb little green light.

Hence, disposing the MGF fluorescent material or the KSF fluorescent material near the light-emitting element 1D as the wavelength conversion member 6 suppresses reduction in the light quantity due to absorption of green light by the wavelength conversion member 6, thereby enhancing the emission efficiency of the light-emitting device 100D.

In particular, using the MGF fluorescent material or the KSF fluorescent material as the wavelength conversion member 6 can suppress reduction in the quantity of green light even in the case where the wavelength conversion member 6 is disposed on the front surface of the light-emitting element 1D as in the case of the front surfaces of the light-emitting elements 1Ca and 1Cb. The sealing resin 3 can be therefore disposed without regard for the difference in emission colors between the light-emitting elements disposed on the bottom surface 23b, and the manufacturing process can be simplified.

The light-emitting device 100D according to the fifth embodiment differs from the light-emitting device 100 according to the first embodiment only in the outer shape of the light-emitting elements 1Ca, 1Cb, and 1D and in the number of light-emitting elements used. The light-emitting device 100D therefore can operate and be manufactured in the same manner as the light-emitting device 100. Thus, their detailed descriptions are omitted.

The outer shape of the light-emitting elements 1Ca, 1Cb, and 1D is not limited to triangles. Parallelograms, trapezoids, and other polygons may be employed as in the above light-emitting devices 100 to 100C, and different outer shapes may be used in combination.

The combination of the emission colors of the light-emitting elements and the fluorescent material is not limited to the above example, and other combinations are possible. Any combinations are acceptable as long as the light-emitting elements 1Ca and 1Cb are different from the light-emitting element 1D in emission colors, the emission peak wavelength of the light-emitting element 1D is longer than the emission peak wavelengths of the light-emitting elements 1Ca and 1Cb, and the emission peak wavelength of the wavelength conversion member 6 used is longer than the emission peak wavelength of the light-emitting element 1D. In this case, the wavelength conversion member 6 preferably has a sufficiently high light reflectance at the emission peak wavelength of the light-emitting element 1D. The sufficiently high light reflectance here means a reflectance of, for example, preferably equal to or more than 40%, more preferably equal to or more than 60%, and further preferably equal to or more than 80%.

Sixth Embodiment

Figure 12A:
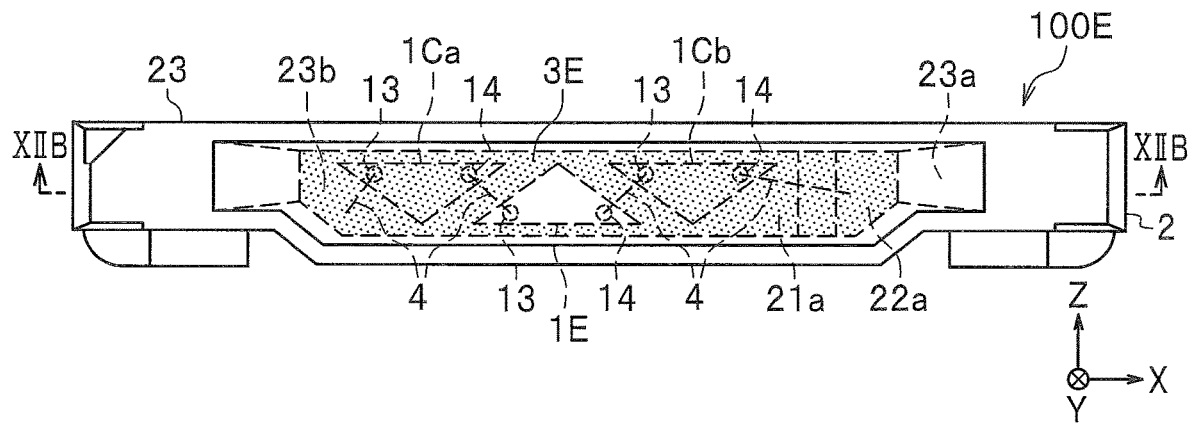
FIG. 12A is a schematic front view for illustrating a constitution of a light-emitting device according to a sixth embodiment.
Figure 12B:
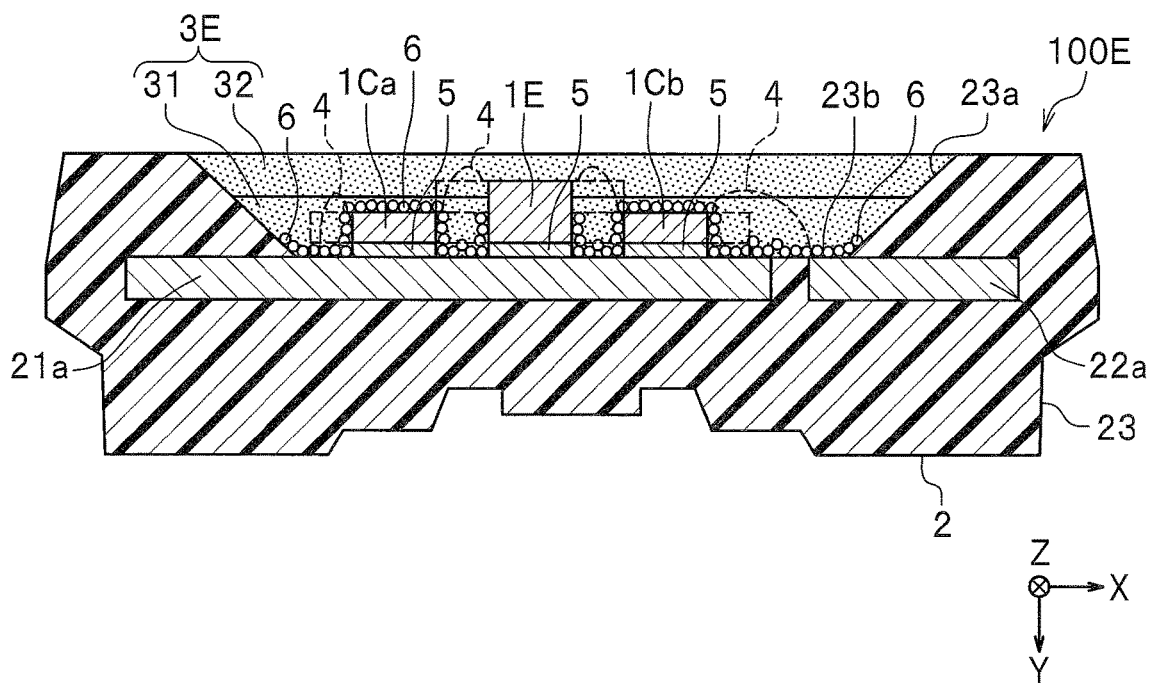
FIG. 12B is a schematic cross-sectional view for illustrating the constitution of the light-emitting device according to the sixth embodiment taken along the line XIIB-XIIB in FIG. 12A.

A light-emitting device according to a sixth embodiment will be described referring to FIG. 12A and FIG. 12B. FIG. 12A is a schematic front view for illustrating a constitution of the light-emitting device according to the sixth embodiment. FIG. 12B is a schematic cross-sectional view for illustrating the constitution of the light-emitting device according to the sixth embodiment taken along the line XIIB-XIIB in FIG. 12A.

In FIG. 12A showing the front view, the region including the wavelength conversion member 6 is indicated by dot-hatching.

A light-emitting device 100E according to the sixth embodiment differs from the light-emitting device 100D according to the fifth embodiment in that the light-emitting device 100E includes a light-emitting element 1E that emits green light instead of the light-emitting element 1D that is disposed at the center and emits green light and in that the wavelength conversion member 6 is not disposed on the front surface of the light-emitting element 1E.

The light-emitting element 1E has a thickness, which is its dimension in the Y-axis direction, larger than the thickness of the light-emitting elements 1Ca and 1Cb.

An sealing resin 3E contains the wavelength conversion member 6 and includes a first layer 31 on the lower side, that is, nearer to the bottom surface 23b, and a second layer 32 containing no wavelength conversion member 6 on the upper side, that is, farther from the bottom surface 23b. The thickness, which is the dimension in the Y-axis direction, of the first layer 31 is larger than the thickness of the light-emitting elements 1Ca and 1Cb and smaller than the thickness of the light-emitting element 1E. The front end surface of the second layer 32 and the opening surface of the recessed portion 23a constitute the same surface.

The other part of the constitution is the same as the constitution of the light-emitting device 100D according to the fifth embodiment, and its detailed description is omitted.

In the light-emitting device 100E according to the sixth embodiment, the wavelength conversion member 6 that emits light having an emission peak wavelength longer than the emission peak wavelength of the light-emitting element 1E is not disposed on the front surface of the light-emitting element 1E that emits light having an emission peak wavelength longer than the emission peak wavelengths of the light-emitting elements 1Ca and 1Cb. Hence, most of light from the light-emitting element 1E can be extracted out of the light-emitting device 100E through the front surface of the light-emitting element 1E even in the case where the wavelength conversion member 6 absorbs much light at the emission peak wavelength of the light-emitting element 1E. Accordingly, decrease in the emission efficiency of light-emitting device 100E and in the green light component can be suppressed even in the case where, for example, a SCASN fluorescent material is used as the wavelength conversion member 6 in the case where the light-emitting element 1E emits green light and the wavelength conversion member 6 emits red light.

Not disposing the wavelength conversion member 6 on the front side of the light-emitting element 1E prevents light emitted from the front surface from being scattered and reduces the chances for the light to be absorbed by the wavelength conversion member 6. Absorption by the whole-surface electrodes, the pad electrodes, and the wires 4 disposed on the front side of the light-emitting element 1E is also reduced because multiple scattering of light on the front surface of the light-emitting element 1E is suppressed. Decrease in the emission efficiency of the light-emitting device 100E is suppressed also from this view point.

Since light scattering on the front surface of the light-emitting element 1E is reduced, the directivity of light emitted from the light-emitting element 1E toward the front direction can be enhanced.

Method for Manufacturing Light-Emitting Device

Figure 13A:
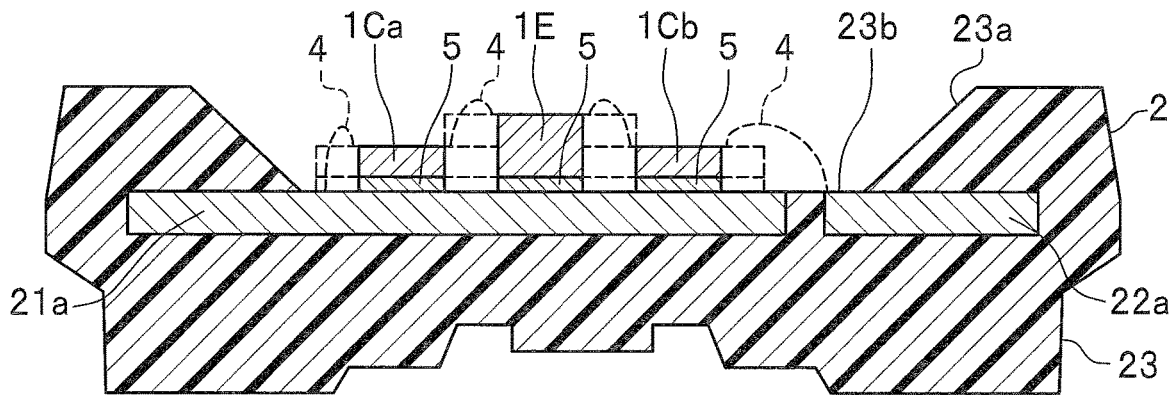
FIG. 13A is a schematic cross-sectional view for illustrating a step of mounting the light-emitting elements in a method for manufacturing the light-emitting device according to the sixth embodiment.
Figure 13B:
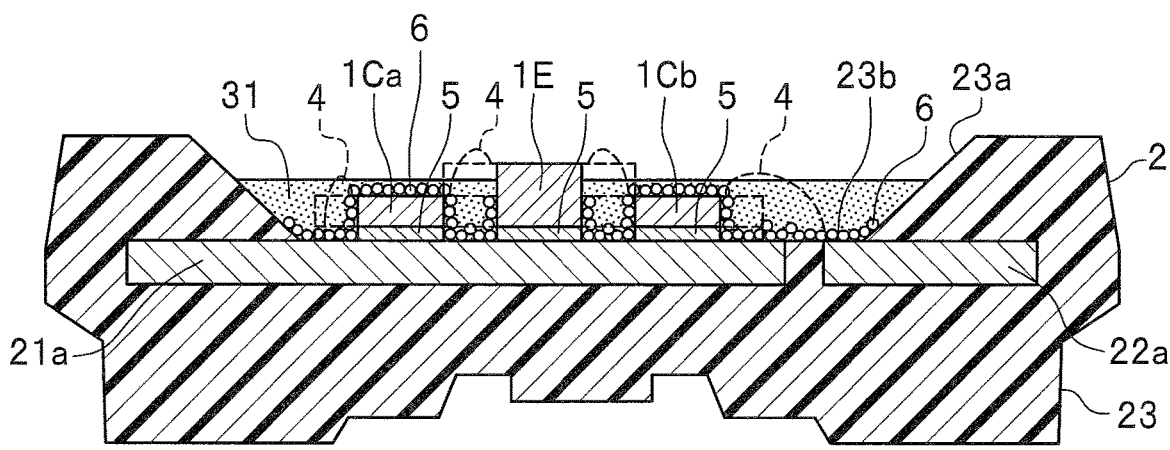
FIG. 13B is a schematic cross-sectional view for illustrating a first step in the step of sealing in the method for manufacturing the light-emitting device according to the sixth embodiment.
Figure 13C:
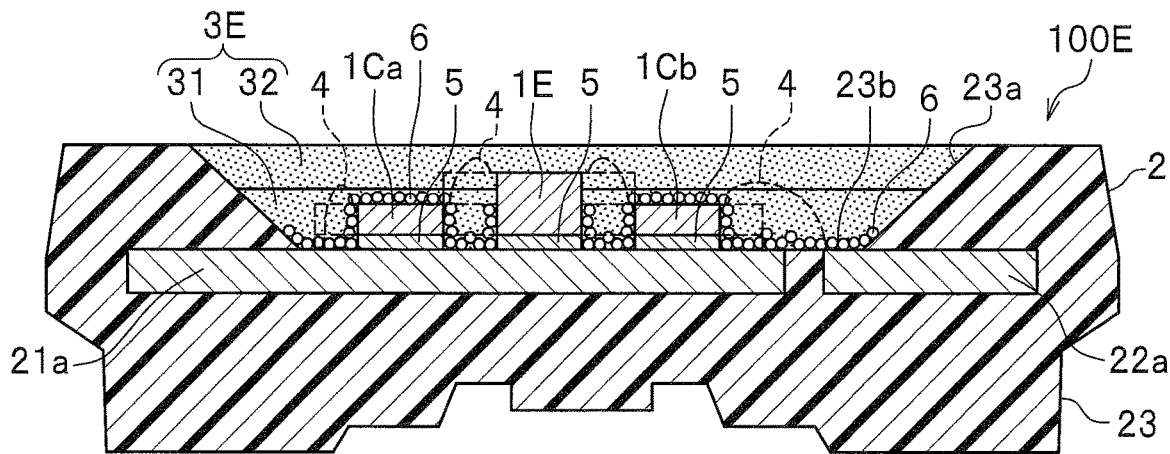
FIG. 13C is a schematic cross-sectional view for illustrating a second step in the step of sealing in the method for manufacturing the light-emitting device according to the sixth embodiment.

A method for manufacturing the light-emitting device 100E according to the sixth embodiment will be described referring to FIG. 13A to FIG. 13C. FIG. 13A is a schematic cross-sectional view for illustrating the step of mounting the light-emitting elements in a method for manufacturing the light-emitting device according to the sixth embodiment. FIG. 13B is a schematic cross-sectional view for illustrating a first step in the step of sealing in the method for manufacturing the light-emitting device according to the sixth embodiment. FIG. 13C is a schematic cross-sectional view for illustrating a second step in the step of sealing in the method for manufacturing the light-emitting device according to the sixth embodiment.

FIG. 13A to FIG. 13C illustrate a cross section at a position corresponding to the line XIIB-XIIB in FIG. 12A.

The light-emitting device 100E according to the sixth embodiment can be manufactured by a modified version of the method for manufacturing the light-emitting device 100 according to the first embodiment modified as described below.

(Step of Providing Light-Emitting Elements)

In step S11 of providing light-emitting elements, the light-emitting elements 1Ca and 1Cb that emit blue light and the light-emitting element 1E that emits green light are provided. At this time, a light-emitting element thicker than the light-emitting elements 1Ca and 1Cb is provided as the light-emitting element 1E.

For example, polishing of the back surface of the substrate 11 is performed before the singulating in the illustrative method for manufacturing light-emitting elements so that the polishing quantity of the light-emitting element 1E will be smaller than the polishing quantities of the light-emitting elements 1Ca and 1Cb when the thickness of the substrate 11 is reduced in this step. Accordingly, the light-emitting element 1E thicker than the light-emitting elements 1Ca and 1Cb can be manufactured. For example, in the case where the substrate 11 before being polished has a thickness of 300 μm and where the substrates 11 of the light-emitting elements 1Ca and 1Cb after being polished will have a thickness of about 100 μm, the substrate 11 of the light-emitting element 1E after being polished can have a thickness of about 150 to 200 μm. The substrate 11 of the light-emitting element 1E may not be polished and have the original thickness of 300 μm.

(Step of Mounting Light-Emitting Elements)

First, in step S131 of bonding the light-emitting elements in step S13 of mounting the light-emitting elements, the light-emitting elements 1Ca, 1Cb, and 1E are bonded to the internal lead portion 21a, which constitutes the bottom surface 23b of the recessed portion 23a of the package 2, using the die-bonding resin 5.

Next, in step S132 of wiring, the wires 4 are disposed to connect the light-emitting element 1Ca, the light-emitting element 1D, and the light-emitting element 1Cb in series between the internal lead portion 21a and the internal lead portion 22a.

(First Step in Step of Sealing)

Next, in the first step in step S14 of sealing, an uncured resin material containing the wavelength conversion member 6 is supplied into the recessed portion 23a of the package 2 by potting or the like, the wavelength conversion member 6 is preferably allowed to sediment, and the resin material is then cured, so that the first layer 31 of the sealing resin 3E is formed.

In step S14 of sealing, the package 2 is put so that the open side of the recessed portion 23a will face up vertically.

(Second Step in Step of Sealing)

Next, in the second step in step S14 of sealing, an uncured resin material without the wavelength conversion member 6 is supplied into the space in the recessed portion 23a, and the resin material is then cured, so that the second layer 32 is formed. Preferably, the resin materials used for the first layer 31 and the second layer 32 at least have the same refractive index. More preferably, the resin materials are the same. This constitution allows for forming of the sealing resin 3E in which the first layer 31 and the second layer 32 are connected without an optical interface between the layers.

It is preferable that the resin material be semi-cured in the first step and that the first layer 31 and the second layer 32 be fully cured at the same time in the second step. This manner can more strongly connect the first layer 31 and the second layer 32.

The light-emitting device 100E according to the sixth embodiment can be manufactured by performing the other steps in the same manner as in the method for manufacturing the light-emitting device 100 according to the first embodiment.

Modification of Method for Manufacturing Light-Emitting Device

Figure 14A:
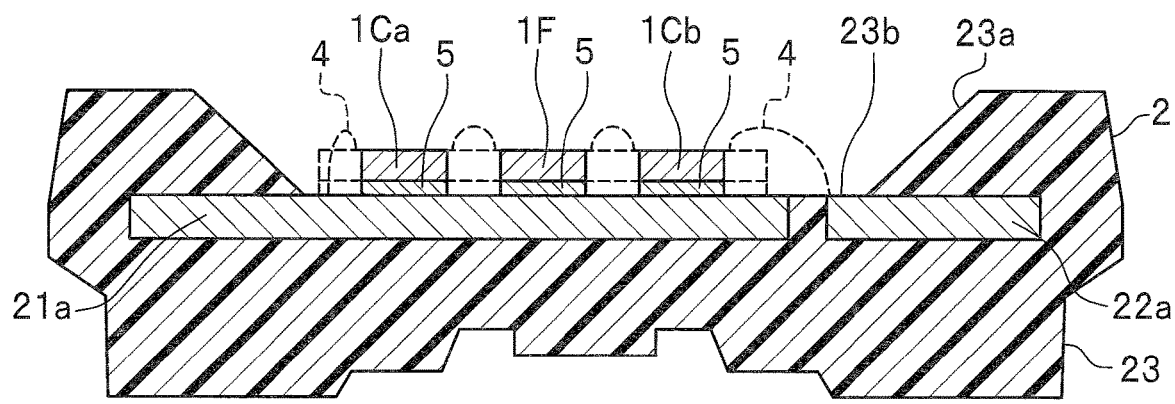
FIG. 14A is a schematic cross-sectional view for illustrating the step of mounting the light-emitting elements in a modification of the method for manufacturing the light-emitting device according to the sixth embodiment.
Figure 14B:
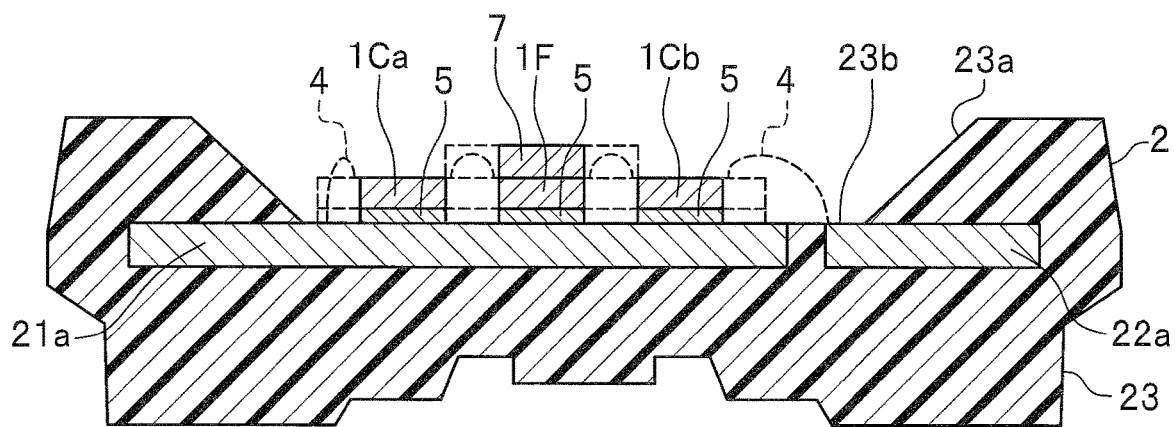
FIG. 14B is a schematic cross-sectional view for illustrating a step of forming a light-transmissive layer in the modification of the method for manufacturing the light-emitting device according to the sixth embodiment.

A modification of the method for manufacturing the light-emitting device according to the sixth embodiment will be described referring to FIG. 14A and FIG. 14B. FIG. 14A is a schematic cross-sectional view for illustrating the step of mounting the light-emitting elements in the modification of the method for manufacturing the light-emitting device according to the sixth embodiment. FIG. 14B is a schematic cross-sectional view for illustrating a step of forming a light-transmissive layer in the modification of the method for manufacturing the light-emitting device according to the sixth embodiment.

FIG. 14A and FIG. 14B illustrate a cross section at a position corresponding to the line XIIB-XIIB in FIG. 12A.

In the modification of the method for manufacturing the light-emitting device according to the sixth embodiment, a light-emitting element 1F that has the same thickness as the light-emitting elements 1Ca and 1Cb and emits green light is used instead of the light-emitting element 1E in the above method for manufacturing the light-emitting device 100E according to the sixth embodiment. Hence, the present modification includes the step of forming a light-transmissive layer between step S13 of mounting the light-emitting elements and step S14 of sealing.

(Step of Mounting Light-Emitting Elements)

First, in step S131 of bonding the light-emitting elements in step S13 of mounting the light-emitting elements, the light-emitting elements 1Ca, 1Cb, and 1F having the same thickness are bonded to the internal lead portion 21a, which constitutes the bottom surface 23b of the recessed portion 23a of the package 2, using the die-bonding resin 5.

Next, in step S132 of wiring, the wires 4 are disposed to connect the light-emitting element 1Ca, the light-emitting element 1D, and the light-emitting element 1Cb in series between the internal lead portion 21a and the internal lead portion 22a.

(Step of Forming Light-Transmissive Layer)

Next, in the step of forming a light-transmissive layer, a light-transmissive layer 7 is formed on the front surface of the light-emitting element 1F. The light-transmissive layer 7 does not contain the wavelength conversion member 6 and is formed of substantially the same resin as for the sealing resin 3E.

In the step of forming a light-transmissive layer, the package 2 is put so that the open side of the recessed portion 23a will face up vertically.

An uncured resin material the viscosity of which is adjusted to a comparatively high degree is supplied onto the front surface of the light-emitting element 1F using a dispenser or the like so that the resin material will not overflow out of the front surface, and the resin material is then cured. The light-transmissive layer 7 can be thus formed. The light-transmissive layer 7 is formed to have a thickness about as large as the difference in thickness between the light-emitting element 1E and the light-emitting element 1F. Hence, the combination of the light-emitting element 1F and the light-transmissive layer 7 can be used as a light-emitting element having about the same thickness as the above light-emitting element 1E.

The light-transmissive layer 7 is not necessarily formed of the uncured resin material but may be formed by bonding a light-transmissive member such as a glass plate and a resin plate having a predetermined thickness using a light-transmissive bonding agent. Instead of forming the light-transmissive layer 7, it is possible to form a mask having the same shape, remove the mask after forming the first layer 31 to expose the front surface of the light-emitting element 1F, and form the second layer 32.

The sealing resin 3E is then formed by the above method, so that the light-emitting device according to the modification can be manufactured.

Seventh Embodiment

Figure 15:
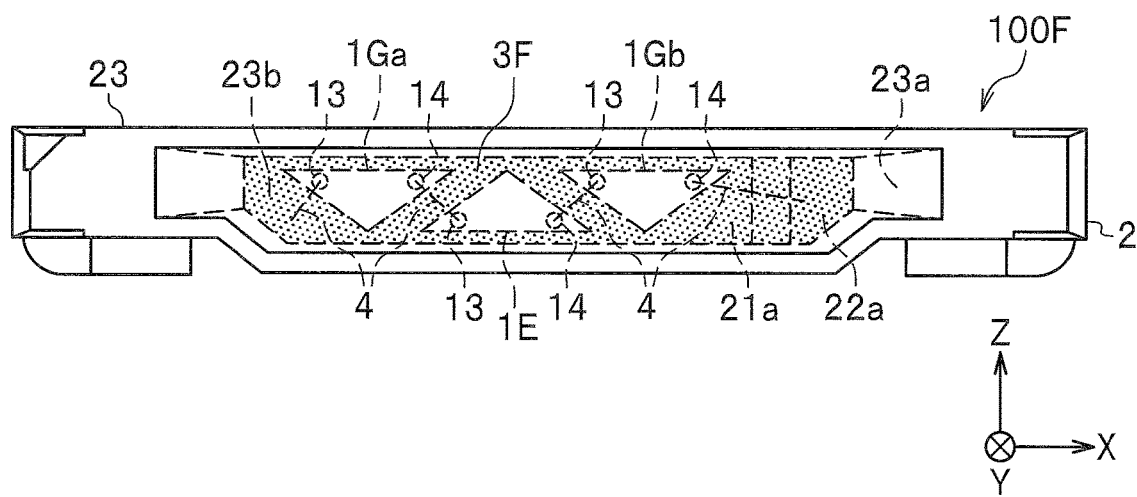
FIG. 15 is a schematic front view for illustrating a constitution of a light-emitting device according to a seventh embodiment.

A light-emitting device according to a seventh embodiment will be described referring to FIG. 15. FIG. 15 is a schematic front view for illustrating a constitution of the light-emitting device according to the seventh embodiment.

In FIG. 15 showing the front view, the region including the wavelength conversion member 6 is indicated by dot-hatching.

A light-emitting device 100F according to the seventh embodiment differs from the light-emitting device 100E according to the sixth embodiment in that the light-emitting device 100F includes light-emitting elements 1Ga and 1Gb that emit blue light and have the same thickness as the light-emitting element 1E instead of the light-emitting elements 1Ca and 1Cb and in that the wavelength conversion member 6 is not disposed also on the front surfaces of the light-emitting elements 1Ga and 1Gb as well as the front surface of the light-emitting element 1E. The light-emitting device 100F includes the lower-side first layer containing the wavelength conversion member 6 and the upper-side second layer containing no wavelength conversion member 6, as the sealing resin 3E in the sixth embodiment. The first layer of an sealing resin 3F is thinner than the light-emitting elements 1Ga, 1Gb, and 1E.

Not disposing the wavelength conversion member 6 on any of the front surfaces of the light-emitting elements 1Ga, 1Gb, and 1E can increase green light from the light-emitting element 1E as well as blue light from the light-emitting elements 1Ga and 1Gb. Also, not disposing the wavelength conversion member 6 on the front surfaces of the light-emitting elements 1Ga, 1Gb, and 1E reduces scattering of light from the light-emitting elements 1Ga, 1Gb, and 1E, thereby reducing absorption of light by the whole-surface electrodes, the pad electrodes, and the wires 4 and enhancing the directivity of the light-emitting device 100F in the front direction.

The light-emitting device 100F according to the seventh embodiment can be manufactured by a modified version of the method for manufacturing the light-emitting device 100E according to the sixth embodiment modified as described below.

In step S11 of providing light-emitting elements, the light-emitting elements 1Ga and 1Gb having the same thickness as the light-emitting element 1E are provided instead of the light-emitting elements 1Ca and 1Cb.

In step S14 of sealing, the first layer 31 that is thinner than the light-emitting elements 1Ga, 1Gb, and 1E and contains the wavelength conversion member 6 is formed, and the second layer 32 containing no wavelength conversion member 6 is formed, so that the sealing resin 3F is formed. The light-transmissive layer 7 may be formed in the same manner as the modification of the manufacturing method according to the sixth embodiment.

The light-emitting device 100F is manufactured by performing the other steps in the same manner as in the sixth embodiment.

Application Example

Constitution of Backlight

Figure 16:
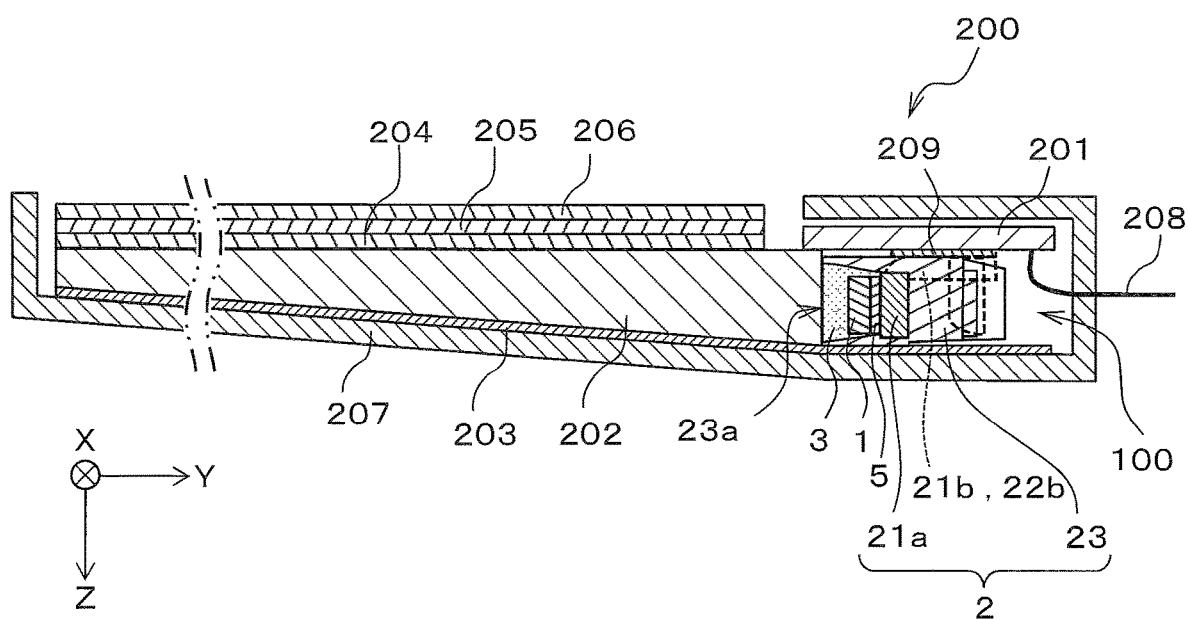
FIG. 16 is a schematic cross-sectional view for illustrating a constitution of a backlight including the light-emitting device according to the first embodiment.

As an application example of the light-emitting devices according to the embodiments, a backlight that is a lighting apparatuses including one of these light-emitting devices will be described referring to FIG. 16. FIG. 16 is a schematic cross-sectional view for illustrating a constitution of the backlight including the light-emitting device according to the first embodiment.

The case where the light-emitting device 100 according to the first embodiment is used will be described as the application example, but any of the light-emitting devices 100A to 100F according to the other embodiments and light-emitting devices according to modifications can be used instead of the light-emitting device 100.

A backlight 200 according to the present application example is a surface-emitting lighting apparatuses suitable for backlighting a liquid-crystal display or the like. The backlight 200 includes a mounting board 201 on which the light-emitting device 100 is mounted, a plate-shaped light-guiding member 202, a light-reflective sheet 203 disposed below the light-emitting device 100 and the light-guiding member 202, and a light-diffusing sheet 204 and prism sheets 205 and 206 layered on the upper side, which is the light-extracting surface side, of the light-guiding member 202. The backlight 200 is housed in a frame 207 having an opening on the upper surface, from which illuminating light is emitted. A wiring pattern of the mounting board 201 is connected to an external power supply via a lead wire 208. The external lead portions 21b and 22b of the light-emitting device 100 are electrically bonded to respective portions of the wiring pattern of corresponding polarities on the mounting board 201 using an electrically-conductive bonding member 209 such as solder.

The light-guiding member 202 is formed of a light-transmissive resin or the like and has a tapered cross-sectional shape in which the thickness decreases from the incident end surface (right lateral surface) side toward the opposite (left lateral surface) side. The incident end surface of the light-guiding member 202 is disposed so as to adhere closely to the open side, which is the light-emission surface of the light-emitting device 100, of the recessed portion 23a. The height of the incident end surface is substantially equal to the height of the light-emitting device 100. Light emitted from the light-emitting device 100 enters the light-guiding member 202 through the incident end surface, propagates through the light-guiding member 202 while being repeatedly reflected and diffused, and is emitted from the upper side of the light-guiding member 202.

The light-reflective sheet 203 is formed of, for example, a resin on which a reflective film of a material such as Ag and Al is formed, and has a function of directing light leaked out from the light-emitting device 100 and the light-guiding member 202 back into these members to enhance the use efficiency of light. The light-diffusing sheet 204 has a function of making the intensity distribution of light emitted from the upper side of the light-guiding member 202 uniform. The prism sheets 205 and 206 are formed of a light-transmissive resin or the like on which many microscopic triangular prisms are formed. The prism sheets 205 and 206 have a function of refracting light incident on their lower surfaces toward the direction of a normal line to the surfaces of the sheets to condense the light. The prism sheet 205 refracts light toward a direction perpendicular to the direction of refraction of the prism sheet 206. The frame 207 is a box formed by bending a plate of a material such as Al and stainless steel.

In the backlight 200 in which light enters the plate-shaped light-guiding member 202 from the lateral surface and is emitted from the main surface side of the light-guiding member 202, unevenness in the luminance and the color of the incident light in the Z-axis direction, which is the thickness direction of the light-guiding member 202, is sufficiently reduced while the light propagates through the light-guiding member 202, as described above. On the other hand, unevenness in the luminance and the color of the incident light in the X-axis direction, which is the width direction of the light-guiding member 202, is not sufficiently reduced within the light-guiding member 202. Hence, the unevenness in the width direction in the luminance and the color of incident light from the light-emitting device 100 greatly affects unevenness in the luminance and the color of the backlight 200.

The light-emitting device 100 has reduced unevenness in luminance and color in the X-axis direction, which is the longitudinal direction of the bottom surface 23b of the recessed portion 23a, as described above. Accordingly, the backlight 200 including the light-emitting device 100 also has reduced unevenness in the luminance and the color of emitted light.

The above has specifically described the light-emitting device according to the present invention referring to the embodiments, but the scope of the present invention is not limited to these descriptions and should be broadly interpreted on the basis of the claims. Needless to say, the scope of the present invention also includes various modifications based on these descriptions.

The light-emitting devices according to the embodiments of the present disclosure can be used for backlights for liquid-crystal displays, a variety of lighting apparatuses, large format displays, various displays for advertisements or destination guide, and various light sources for digital video cameras, image scanners in apparatuses such as facsimile machines, copying machines, and scanners, projectors, and other apparatuses.

The invention claimed is:

1. A light-emitting device comprising:
   a package having a recessed portion, the recessed portion being defined by:
      a bottom surface having a longitudinal direction and a short direction; and
      lateral walls surrounding the bottom surface;
   a first light-emitting element and a second light-emitting element aligned in the longitudinal direction of the bottom surface on the bottom surface of the recessed portion; and
   a wavelength conversion member provided in the recessed portion so as to convert light from the first light-emitting element into light having a different wavelength,
   wherein the first light-emitting element and the second light-emitting element each have a polygonal shape other than a rectangular shape in a front view from a direction substantially perpendicular to the bottom surface, wherein the first light-emitting element and the second light-emitting element are disposed on the bottom surface away from each other so that a longest side of each of the first light-emitting element and the second light-emitting element is parallel to or substantially parallel to the longitudinal direction of the bottom surface and so that a first side of the first light-emitting element and a second side of the second light-emitting element facing the first side are parallel to or substantially parallel to each other in the front view, wherein the wavelength conversion member is disposed at least in a region on the bottom surface between the first light-emitting element and the second light-emitting element, wherein the first light-emitting element and the second light-emitting element each have a first acute corner and a second acute corner provided on opposite ends thereof in the longitudinal direction and each have an upper surface on which a first electrode and a second electrode are respectively disposed adjacent to the first acute corner and the second acute corner, wherein at least a portion of the second acute corner of the first light-emitting element overlaps at least a portion of the first acute corner of the second light emitting element in the short direction, wherein the second electrode of the first light-emitting element is directly electrically connected by a wire to the first electrode of the second light emitting element, and wherein the first electrode includes a connecting portion provided adjacent to the first acute corner, the wire being connected to the connecting portion, the first electrode further including an extending portion extending along a diagonal line that extends from the first acute corner, the extending portion extending from the connecting portion away from the first acute corner.

2. The light-emitting device according to claim 1, wherein the first light-emitting element and the second light-emitting element each have a parallelogrammic, trapezoidal, or triangular shape in the front view.

3. The light-emitting device according to claim 1, wherein the first side of the first light-emitting element and the second side of the second light-emitting element are each inclined at an angle in a range of 15° to 75° with respect to the longitudinal direction of the bottom surface in the front view.

4. The light-emitting device according to claim 1, wherein an emission peak wavelength of the first light-emitting element is shorter than an emission peak wavelength of the second light-emitting element.

5. The light-emitting device according to claim 1, wherein the bottom surface has a rectangular or substantially rectangular shape in the front view,
wherein the longest side of the first light-emitting element faces one long side of the bottom surface in the front view, and
wherein the longest side of the second light-emitting element faces another long side of the bottom surface in the front view.

6. The light-emitting device according to claim 1, wherein orthographic projections of the first side and the second side onto a line parallel to the longitudinal direction of the bottom surface overlap each other.

7. The light-emitting device according to claim 1, wherein an outer shape of the first light-emitting element and an outer shape of the second light-emitting element are substantially same in the front view.

8. The light-emitting device according to claim 1, wherein an emission color of the first light-emitting element and an emission color of the second light-emitting element are substantially same.

9. The light-emitting device according to claim 1, wherein a portion of the first light-emitting element, the portion opposite to the second light-emitting element in the longitudinal direction of the bottom surface, is electrically connected to an electrode disposed on the bottom surface via an electrically-conductive member extending in the short direction of the bottom surface in the front view.

10. The light-emitting device according to claim 1, wherein the wavelength conversion member comprises at least one of an oxide fluorescent material, a fluoride fluorescent material, a nitride fluorescent material, and an oxynitride fluorescent material.

11. The light-emitting device according to claim 1, wherein the wavelength conversion member covers an upper surface of the first light-emitting element and an upper surface of the second light-emitting element.

12. The light-emitting device according to claim 1, further comprising a third light-emitting element,
wherein the first light-emitting element, the second light-emitting element, and the third light-emitting element are aligned in this order in the longitudinal direction of the bottom surface,
wherein the third light-emitting element has a polygonal shape other than a rectangular shape in the front view,
wherein the third light-emitting element is disposed away from the second light-emitting element on the bottom surface so that a longest side of the third light-emitting element is parallel to or substantially parallel to the longitudinal direction of the bottom surface and so that a third side of the second light-emitting element and a fourth side of the third light-emitting element facing the third side are parallel to or substantially parallel to each other in the front view,
wherein an emission peak wavelength of the first light-emitting element and an emission peak wavelength of the third light-emitting element are substantially same,
wherein an emission peak wavelength of the second light-emitting element is longer than the emission peak wavelength of the first light-emitting element and the third light-emitting element, and
wherein the wavelength conversion member is disposed in a region on the bottom surface between the second light-emitting element and the third light-emitting element.

13. The light-emitting device according to claim 12, wherein the third light-emitting element has a parallelogrammic, trapezoidal, or triangular shape in the front view.

14. The light-emitting device according to claim 12, wherein the wavelength conversion member covers at least one of lateral surfaces and an upper surface of each of the first light-emitting element, the second light-emitting element, and the third light-emitting element.

15. The light-emitting device according to claim 14, wherein the first light-emitting element and the third light-emitting element emit blue light,
wherein the second light-emitting element emits green light, and
wherein the wavelength conversion member emits red light.

16. The light-emitting device according to claim 14,
wherein the wavelength conversion member comprises a fluorescent material having a light reflectance of equal to or more than 80% at the emission peak wavelength of the second light-emitting element.

17. The light-emitting device according to claim 14,
wherein the emission peak wavelength of the first light-emitting element and the emission peak wavelength of the third light-emitting element are in a range of 380 nm to 485 nm,
wherein the emission peak wavelength of the second light-emitting element is in a range of 485 nm to 573 nm, and
wherein the wavelength conversion member comprises a fluorescent material having an emission peak wavelength in a range of 584 nm to 780 nm and having a light reflectance of equal to or more than 80% at the emission peak wavelength of the second light-emitting element.

18. The light-emitting device according to claim 14,
wherein the wavelength conversion member comprises a fluoride fluorescent material represented by $K_2SiF_6$:Mn or a germanate-salt fluorescent material represented by $3.5MgO.0.5MgF_2.GeO_2$:Mn.

19. The light-emitting device according to claim 12,
wherein an emission peak wavelength of the wavelength conversion member is longer than the emission peak wavelength of the second light-emitting element, and
wherein the wavelength conversion member is not disposed on an upper surface of the second light-emitting element.

20. A backlight comprising:
the light-emitting device according to claim 1; and
a flat plate-shaped light-guiding member,
wherein the light-emitting device and the flat plate-shaped light-guiding member are disposed so that an open side of the recessed portion faces a lateral surface of the flat plate-shaped light-guiding member.

* * * * *